United States Patent [19]

Harafuji et al.

[11] Patent Number: 5,869,402
[45] Date of Patent: Feb. 9, 1999

[54] PLASMA GENERATING AND PROCESSING METHOD AND APPARATUS THEREOF

[75] Inventors: Kenji Harafuji; Masafumi Kubota, both of Osaka, Japan

[73] Assignee: Matsushita Electric Industrial Co., Ltd., Osaka, Japan

[21] Appl. No.: 438,737

[22] Filed: May 10, 1995

[30] Foreign Application Priority Data

Jun. 13, 1994 [JP] Japan .................................. 6-130552

[51] Int. Cl.$^6$ .................................................... H05H 1/00
[52] U.S. Cl. ...................... 438/729; 216/71; 118/723 E; 156/345; 427/569
[58] Field of Search ................................ 156/345, 643.1, 156/626.1, 627.1; 216/67, 71, 59; 118/723 E, 723 R; 204/192.33, 192.13, 298.32, 298.03, 298.08, 298.34; 427/569; 438/729

[56] References Cited

U.S. PATENT DOCUMENTS 5,415,718  5/1995  Ohmi et al. .............................. 156/345

OTHER PUBLICATIONS

N. Mutsukura et al., "Plasma sheath thickness in radio-frequency discharges", 1990 American Institute of Physics, J. Appl. Phys. 68(6), Sep. 15, 1990, 2657–2660.

K. Harafuji et al., "RF Glow Discharge and Ion Transport: Effects of Applied Frequency, Gas Pressure and Method of Power Coupling," Jpn. J. Appl. Phys. vol. 33 (1994), pp. 2212–2222 Part 1, No. 4B, 1994.

Primary Examiner—Thi Dang
Attorney, Agent, or Firm—McDermott, Will & Emery

[57] ABSTRACT

A reactive gas is introduced into a vacuum chamber by a gas controller so that a plasma is generated in a plasma generation region. Subsequently, high-frequency power from a high-frequency power source is applied to a sample stage in the vacuum chamber so that ions in the plasma are made incident upon the sample stage, thereby performing dry etching with respect to a sample on the sample stage. In main etching, a value of (pressure of reactive gas)/(frequency of high-frequency power) is reduced so as to reduce a scattering probability, which is the probability of ions being scattered in collision with neutral particles in a sheath region, thereby increasing the energy of ion fluxes and making the incidence directions of the ion fluxes perpendicular to a surface of the sample stage. In overetching, the value of (pressure of reactive gas)/(frequency of high-frequency power) is increased so as to increase the above scattering probability, thereby reducing the energy of the ion fluxes and tilting the incidence directions of the ion fluxes from a perpendicular to the surface of the sample stage.

25 Claims, 19 Drawing Sheets

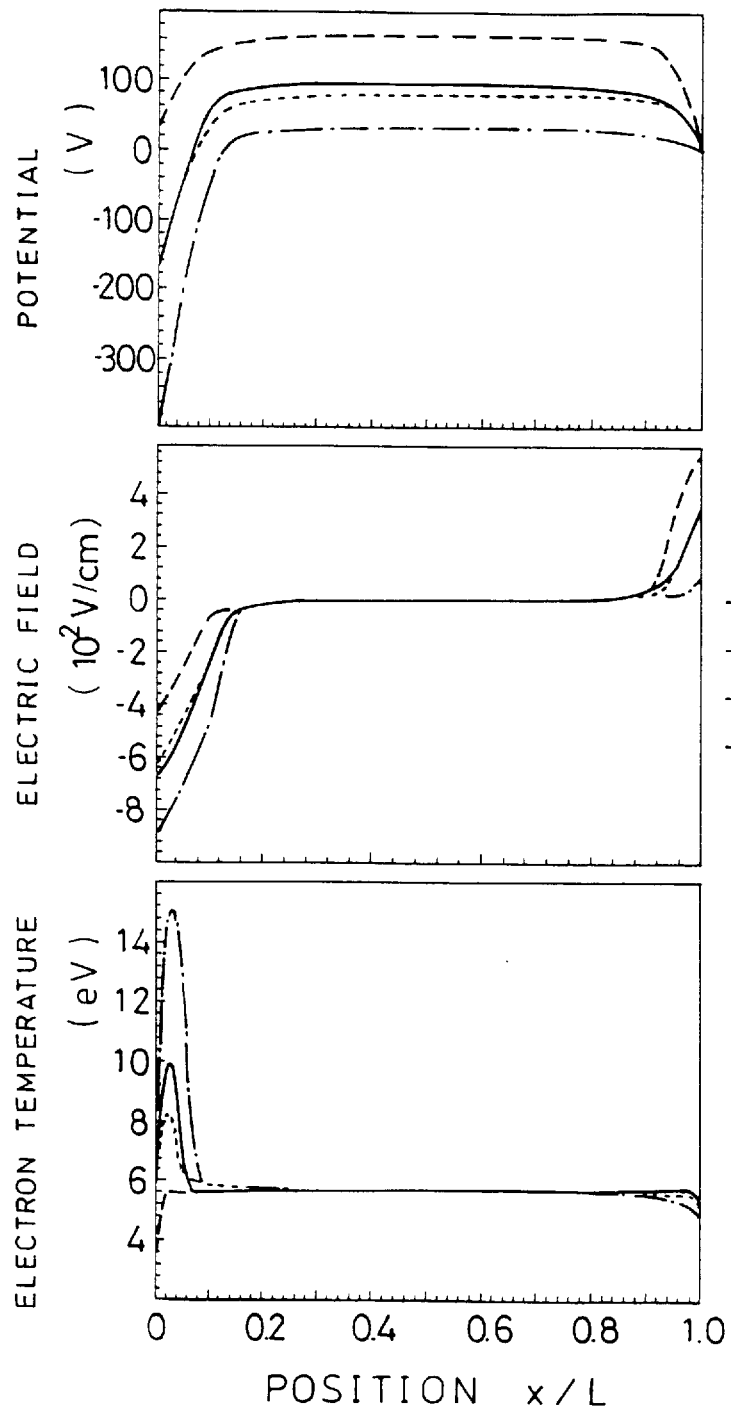

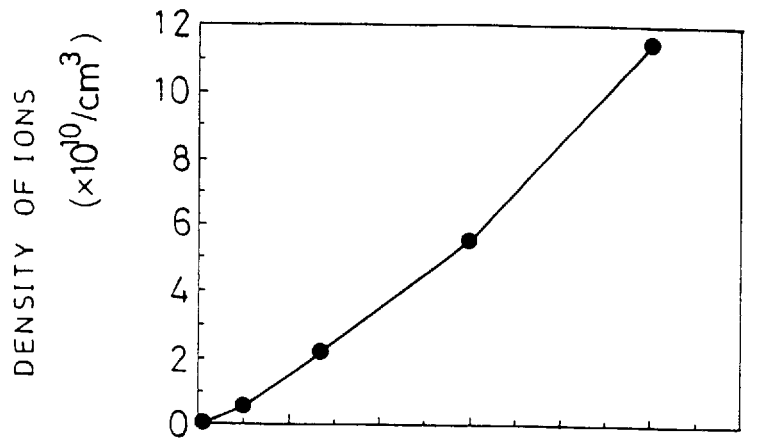
F I G. 4 (a)
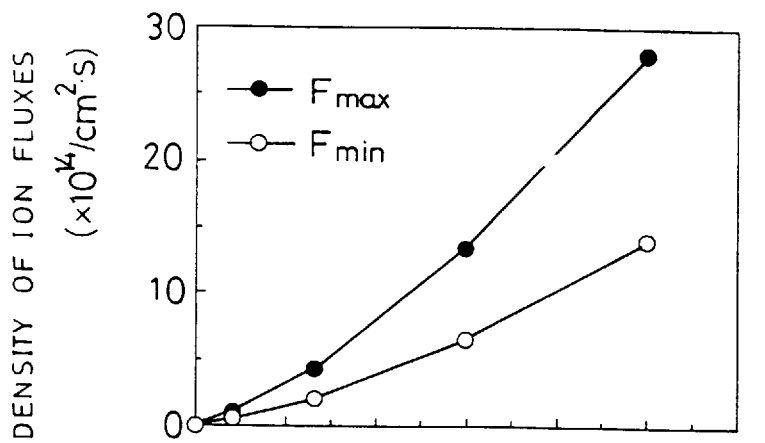
F I G. 4 (b)
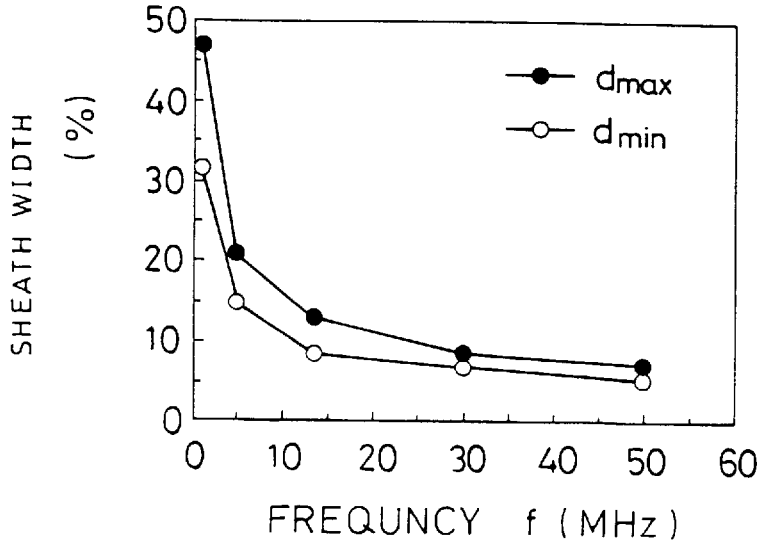
F I G. 4 (c)

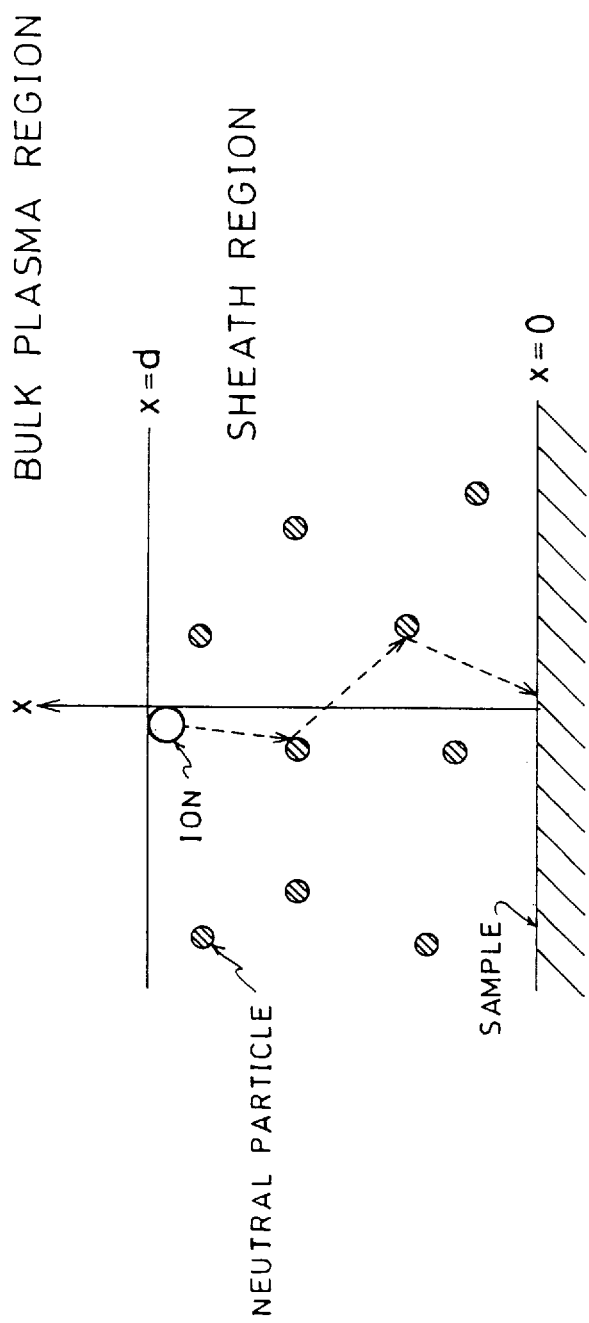

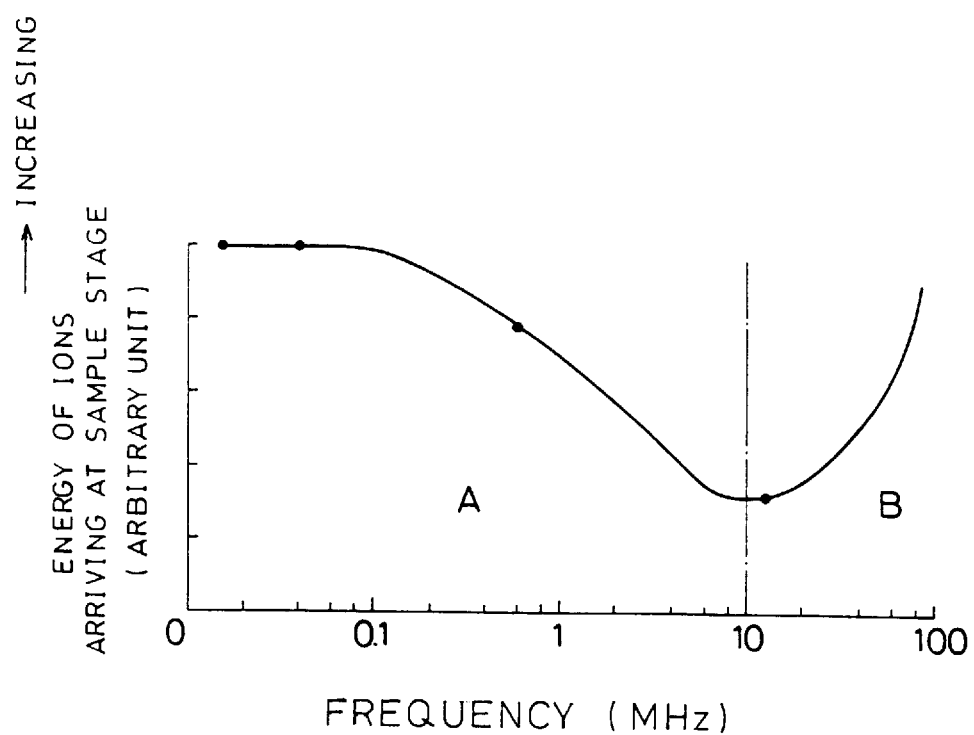

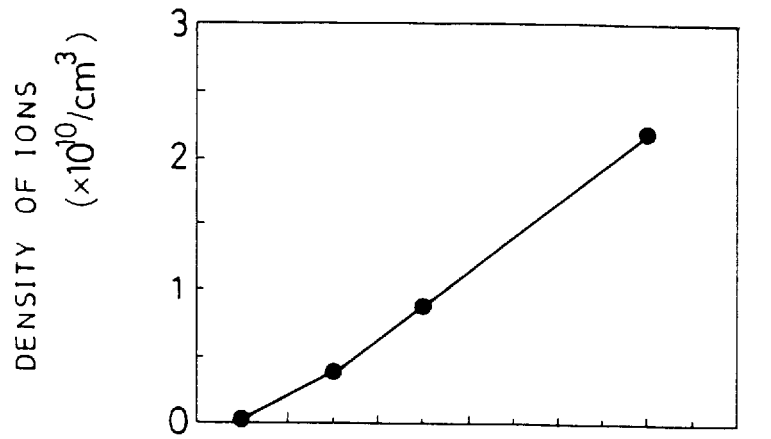
F I G. 8 ( a )
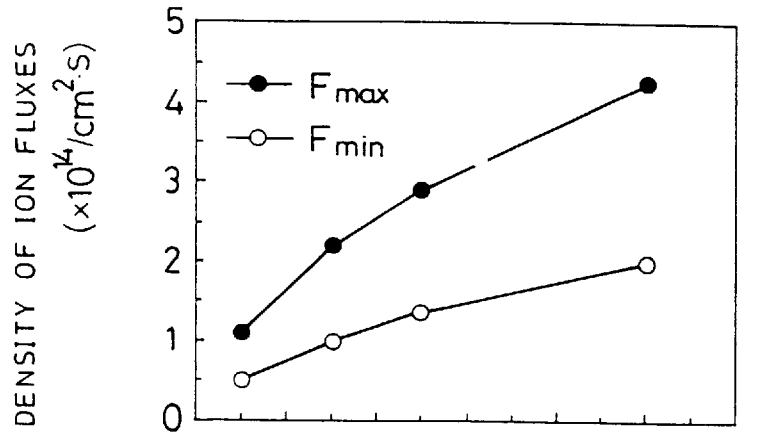
F I G. 8 ( b )
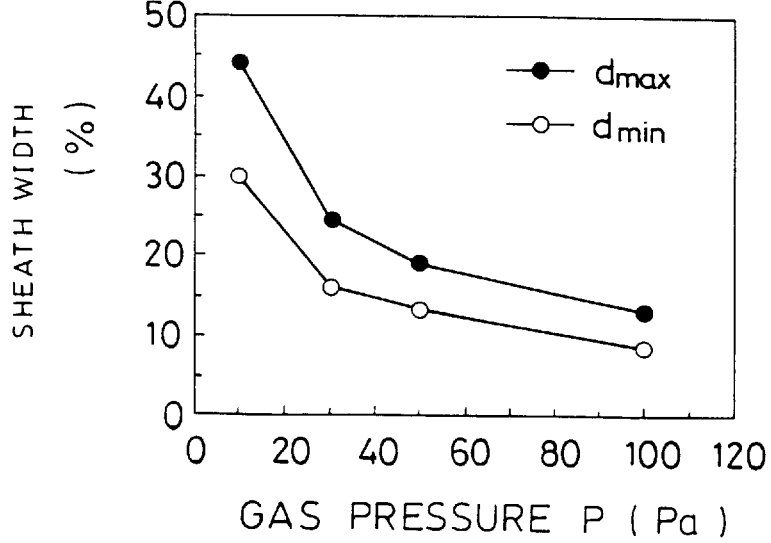
F I G. 8 ( c )

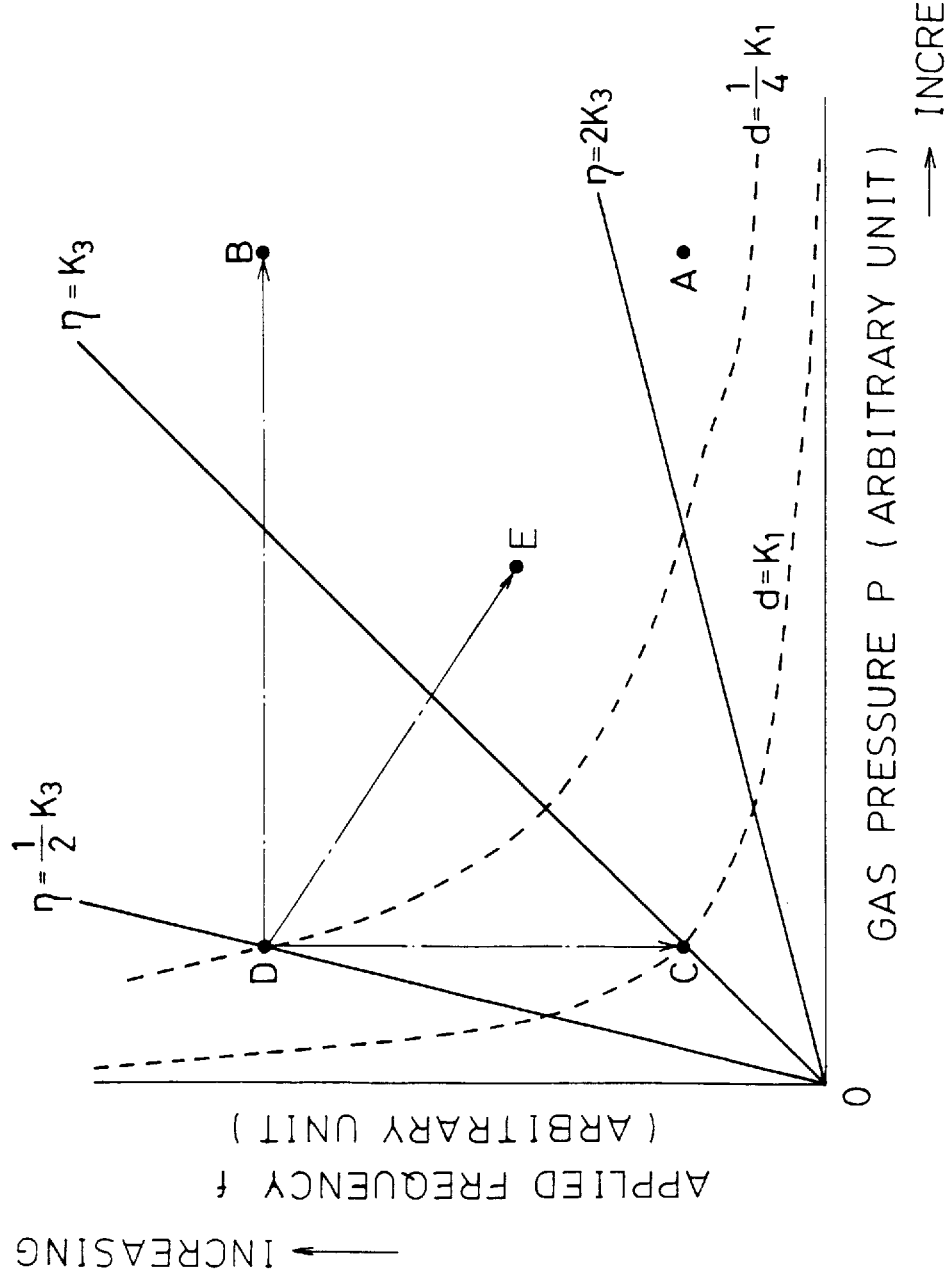

F I G. 12 ( a )
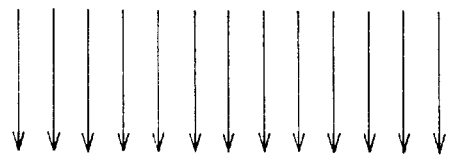
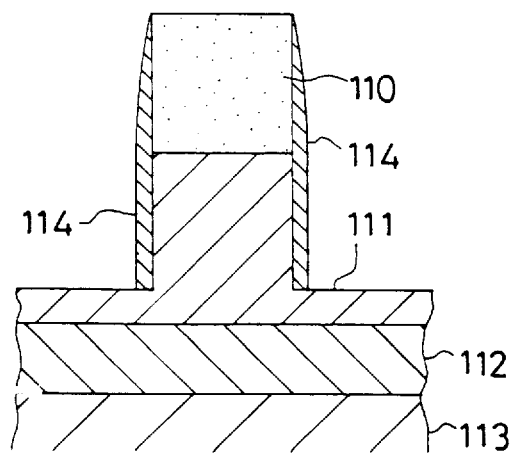
F I G. 12 ( b )
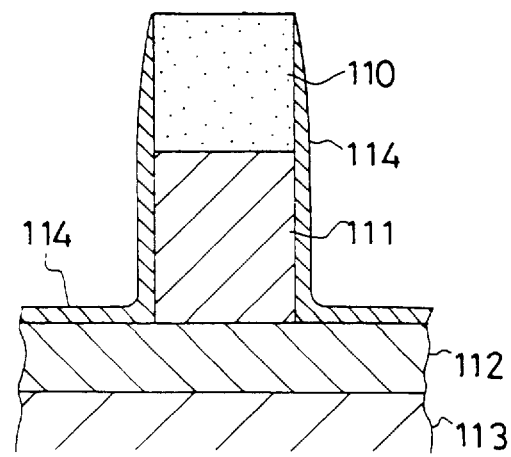

FIG.13(a) PRIOR ART
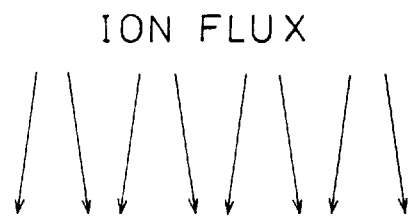
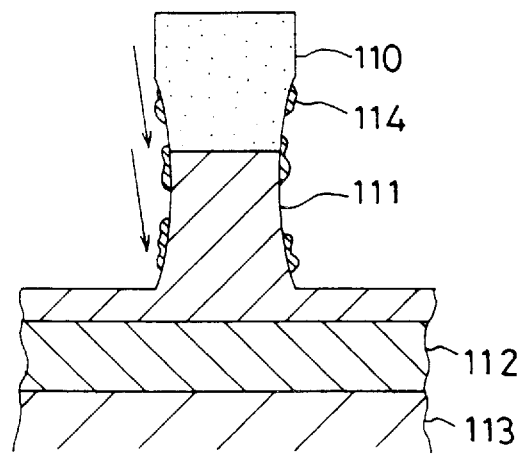
FIG.13(b) PRIOR ART
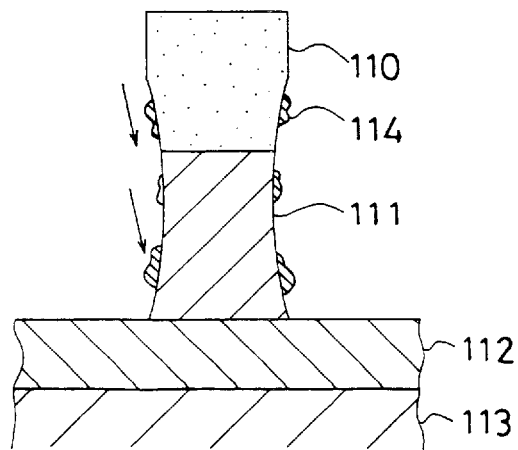

(DISTRIBUTION OF MAGNETIC FIELD INTENSITY IMMEDIATELY ABOVE SAMPLE STAGE)

PLASMA GENERATING AND PROCESSING METHOD AND APPARATUS THEREOF

BACKGROUND OF THE INVENTION

The present invention relates to a plasma generating and processing method and to an apparatus for use in the method.

As an arrangement for practicing a plasma generating and processing method, there has been known one in which a sample stage serving as a cathode electrode is disposed in a chamber of a plasma generating apparatus. With the arrangement, high-frequency power is applied to the sample stage to form a dc self-bias, thereby accelerating ions toward the sample stage. The accelerated ions are used either primarily or subordinately to process a sample on the sample stage.

The plasma generating and processing method using high-frequency discharge has various applications in such fields as plasma CVD, sputtering, and ion implantation, which are used in dry etching techniques and thin-film forming techniques that necessitate micro-processing.

Recent advances in high-density semiconductor integrated circuit devices have been bringing about changes comparable to those caused by the Industrial Revolution. Higher densities have been achieved in semiconductor integrated circuits by device miniaturization, device improvements, and an increasing area occupied by a chip. Among these, device miniaturization has reached a point on the order of the wavelengths of light, so that the use of excimer laser and soft X-rays has been considered. In forming micro-patterns, dry etching and thin-film formation as well as lithography have been playing an important role.

Below, an examination will be made of dry etching process applied to micro-processing techniques for semiconductor substrates.

The dry etching process is a technique for removing unwanted portions of a thin film or a semiconductor substrate, which serves as a material to be etched, by utilizing chemical or physical reactions between radicals and ions generated by a plasma and the surface of a solid phase of the material to be etched. Of all the dry etching techniques, reactive ion etching (RIE) is most widely used. In RIE, a sample is exposed to a plasma obtained by subjecting an appropriate reactive gas to high-frequency discharge, so that unwanted portions at the surface of the sample are removed by etching reactions. The wanted portions at the surface of the sample are normally protected by a photoresist pattern used as a mask.

In main etching, to realize substantially vertical etching profiles with complete fidelity to a minuscule mask pattern at a high etching rate, it is required that large ion fluxes should be incident at high energy upon a sample in directions substantially vertical to a surface thereof. To meet the requirement, it is essential to minimize the number of times that ions in the plasma are scattered in collision with neutral particles, while they are accelerated toward the sample stage in a sheath region formed in the vicinity thereof.

In overetching, on the other hand, it is required that the ion fluxes should not be incident at high energy upon the sample in directions substantially vertical to the surface thereof in order to enhance the etching selectivity to an underlying material.

To fulfill the above requirements, there has conventionally been adopted an arrangement in which the power of a high-frequency power source is increased in main etching, while it is reduced in overetching or another arrangement in which a gas for forming a protective thin film on the surface of the underlying material is additionally introduced at the time when the underlying material is exposed, thereby performing two-level etching.

Next, an examination will be made of thin-film forming process using plasma CVD, which is applied to micro-processing techniques for semiconductor substrates.

In forming a thin film by directing reactive products generated in the plasma, such as neutral radicals, to the sample on the sample stage, it is generally required to form a uniform thin film over the surface of the sample with concave and convex portions that are either rectangular or circular in cross section.

However, a thin film deposited on the surface of the sample with concave and convex portions becomes thickest at the upper edge corners of a concave portion, since the prospective landing solid angle at which the reactive products, such as the neutral radicals, land on the surface on the sample in substantially conformal directions becomes largest there. Conversely, the deposited film on the surface of the sample becomes thinnest at the lower edge corners of a convex portion, since the prospective landing solid angle becomes smallest there. Moreover, the deposited film becomes comparatively thick on the surface of the sample, since the prospective landing solid angle is comparatively large there. The prospective landing solid angle becomes particularly small at the bottom of the convex portion at the surface of the sample, since the deposited film formed on the periphery of the convex portion is jutting out over the upper edges thereof, so that the deposited film becomes thin at the bottom. Accordingly, the deposited film is filled in the convex portion only unsatisfactorily, which often results in voids.

To prevent the above phenomenon and form a uniform thin film on the surface of the sample with rectangular and circular concave and convex portions, there has conventionally been adopted a method in which, after the thin-film forming process was performed for a specified period of time, a sample is taken out of a thin-film forming apparatus and temporarily placed in a sputtering apparatus, so that those portions of the deposited film which are jutting out, in the course of the thin-film forming process, from the upper edge corners of a concave portion at the surface of the sample are removed by ion sputtering, thereby increasing the prospective landing solid angle at the bottom of the convex portion of the sample. Thereafter, the semiconductor substrate is placed in the plasma CVD apparatus again. Thus, by placing the sample alternately in the thin-film forming apparatus and the sputtering apparatus and alternately performing the thin-film forming process and the ion sputtering process, a thin film uniform in thickness is formed over the surface of the sample with concave and convex portions with excellent step coverage.

However, although the above etching method in which the power of the high-frequency power source is switched between two levels can control the density of ion fluxes, it cannot control the energy distribution of ions and the incidence angle distribution thereof satisfactorily, so that it is difficult to obtain a sufficiently high etching rate, substantially vertical etch profiles, and sufficiently high selectivity. A combination of the method in which the power of the high-frequency power source is switched between two levels and the method in which a gas is additionally introduced in overetching also has similar disadvantages.

Furthermore, since the process of forming a thin film by plasma CVD and the process of removing the thick portions of the film by sputtering are performed individually in the different apparatus, throughput in processing is significantly reduced.

SUMMARY OF THE INVENTION

An object of the present invention, which has been achieved in view of the forgoing, is to enable the incidence of ions upon a sample stage at high energy in directions perpendicular to a surface of the sample stage or at low energy in various directions which are not perpendicular to the surface of the sample stage, thereby processing a sample by means of a plasma with high precision.

The present invention has been achieved based on the finding that, if a value of (pressure of reactive gas introduced into chamber)/(frequency of high-frequency power applied to sample stage in chamber) is changed, the probability of ions in the plasma being scattered in collision with neutral particles in the reactive gas in a sheath region on the side of the sample stage is also changed and, along with that, the energy of ion fluxes incident upon the sample stage and the incidence directions of the ion fluxes are also changed.

A description will be given first to the relationship between the value of (pressure of gas introduced into chamber)/(frequency of high-frequency power applied to sample stage) and a scattering probability which is the probability of the ions in the plasma being scattered in collision with the neutral particles in the reactive gas.

A length d of a sheath region on the side of a cathode formed in the vicinity of the sample stage is represented by the following expression:

$$d = K_1/(P^m \cdot f^n)$$

where $K_1$ is a constant, P is the pressure of a reactive gas introduced into the chamber, f is the frequency of high-frequency power applied to the sample stage, m is a positive real number larger than about ⅓ and smaller than about ½, and n is a positive real number larger than about ½ and smaller than about 1. As can be understood from the foregoing expression, the length d of the sheath region is inversely proportional to the gas pressure P to the m-th power and to the frequency f to the n-th power, which has already been reported in documents (K. Harafuji, A. Yamano and M. Kubota; The 15th Symposium on Dry Process, 1993 and N. Mutsukura, K. Kobayashi and Y. Machi; J. Appl. Phys. Vol. 68 (1990), p.2657).

The mean free path λ of ions primarily derived from the scattering of the ions caused by elastic collisions between the ions and the neutral particles and by charge exchange therebetween is represented by the following expression:

$$\lambda = K_2/P$$

where $K_2$ is a constant. As can be understood from the foregoing expression, the mean free path λ of ions is inversely proportional to the pressure P of the reactive gas.

From these expressions, there can be derived a scattering probability η on the average, which is the probability of ions having started from the boundary region between a bulk plasma region and the sheath region being scattered in collision with the neutral particles in the sheath region while they are travelling in the sheath region toward the sample stage as the cathode electrode:

$$\eta = d/\lambda = (K_1/(P^m \cdot f^n)) \times (P/K_2)$$
$$= (K_1/K_2) \times (P^{1-m}/f^n) \sim (K_1/K_2) \times (P/f)^{1/2}$$

Therefore, it can be understood that the value of (pressure P of reactive gas)/(frequency f of high-frequency power applied to sample stage) (hereinafter abbreviated as P/f) is proportional to the scattering probability η in the sheath region on the side of the sample stage.

The plasma generating and processing method according to the present invention comprises: a plasma generating step of introducing a reactive gas into a vacuum chamber and generating a plasma in a plasma generation region; and a plasma processing step of applying high-frequency power to a sample stage in the vacuum chamber so that ions in the plasma are made incident upon the sample stage and perform process with respect to a sample on the sample stage, wherein the plasma processing step comprises the step of changing a value of (pressure of reactive gas)/(frequency of high-frequency power), thereby changing a scattering probability which is the probability of the ions being scattered in collision with neutral particles in a sheath region on the side of the sample stage, and thereby changing the energy of ion fluxes incident upon the sample stage and the incidence directions of the ion fluxes.

If P/f is small, the scattering probability η also becomes small, so that the ions are less likely to collide with the neutral particles in the sheath region. As a result, the energy decay of the ion fluxes is suppressed and the ion fluxes are incident upon the sample stage in directions perpendicular to a surface thereof. Conversely, if P/f is large, the scattering probability η also becomes large, so that the ions are more likely to collide with the neutral particles in the sheath region. As a result, the energy decay of the ion fluxes is promoted and the ion fluxes are incident upon the sample stage in random directions.

Since it is thus possible to control the magnitude of the energy of ion fluxes and the incidence directions thereof with respect to the sample stage, processing with the plasma can be optimized.

In the case where the above plasma generating and processing method is applied to dry etching techniques, the process performed by the ions with respect to the sample on the sample stage is dry etching process and the plasma processing step further comprises the step of reducing the value of (pressure of reactive gas)/(frequency of high-frequency power) and the scattering probability in main etching, thereby increasing the energy of the ion fluxes and making the incidence directions of the ion fluxes perpendicular to a surface of the sample stage, while increasing the value of (pressure of reactive gas)/(frequency of high-frequency power) and the scattering probability in overetching, thereby reducing the energy of the ion fluxes and tilting the incidence directions of the ion fluxes from a perpendicular to the surface of the sample stage.

With the arrangement, since P/f and the scattering probability are small in main etching, the energy of ion fluxes is increased and the ion fluxes are incident upon the sample stage in directions perpendicular to the surface thereof, thereby providing vertical etch profiles and high throughput in processing. On the other hand, since P/f and the scattering probability are large in overetching, the energy of ion fluxes is reduced and the incidence directions of the ion fluxes are tilted from a perpendicular to the surface of the sample stage, so that high selectivity to an underlying material can be achieved.

Preferably, the value of (pressure of reactive gas)/ (frequency of high-frequency power) is reduced and increased in main etching and in overetching, respectively, by setting the frequency of the high-frequency power at a constant value both in main etching and in overetching and by reducing and increasing the pressure of the reactive gas in main etching and in overetching, respectively.

Thus, if the pressure of the reactive gas is changed while maintaining the frequency of the high-frequency power at a constant value, P/f can be changed by simple mechanical operation. On the other hand, if the pressure of the reactive gas is increased, the amount of etching performed by an increased amount of radicals is significantly increased, so that it is not required to lower the etching rate even in overetching.

Preferably, the value of (pressure of reactive gas)/(frequency of high-frequency power) is reduced and increased in main etching and in overetching, respectively, by setting the pressure of the reactive gas at a constant value both in main etching and in overetching and by increasing and reducing the frequency of the high-frequency power in main etching and in overetching, respectively.

Thus, if the frequency of the high-frequency power is changed while maintaining the pressure of the reactive gas at a constant value, P/f can be changed electrically, and that stably in a short period of time. Therefore, not only P/f but also the operation mode can be changed without changing the chemical gas composition in the plasma.

Preferably, the value of (pressure of reactive gas)/(frequency of high-frequency power) is reduced and increased in main etching and in overetching, respectively, by reducing the pressure of the reactive gas and increasing the frequency of the high-frequency power in main etching and by increasing the pressure of the reactive gas and reducing the frequency of the high-frequency power in overetching.

Thus, if P/f is changed by simultaneously changing the pressure of the reactive gas and the frequency of the high-frequency power, not only P/f but also the operation mode can be changed without considerably changing the pressure of the reactive gas and the frequency of the high-frequency power. Therefore, each of a variation in the gas composition in the plasma and a burden on the high-frequency power can be reduced.

Preferably, the value of (pressure of reactive gas)/(frequency of high-frequency power) is changed in main etching and in overetching so that the scattering probability in overetching becomes 1.5 times the scattering probability in main etching or higher.

With the arrangement, since the energy of ions is sufficiently small in overetching, high selectivity can be achieved.

If the scattering probability is defined as (length of sheath region on sample-stage side)/(mean free path of ions in sheath region on sample-stage side), the value of (pressure of reactive gas)/(frequency of high-frequency power) is preferably determined so that the value of the scattering probability becomes 6 or less in main etching.

With the arrangement, since the energy of the ions fluxes is surely increased and the incidence directions of the ion fluxes are surely made perpendicular to the surface of the sample stage, vertical etch profiles can be realized at a high etching rate.

If the scattering probability is defined as (length of sheath region on sample-stage side)/(mean free path of ions in sheath region on sample-stage side), the value of (pressure of reactive gas)/(frequency of high-frequency power) is preferably determined so that the value of the scattering probability becomes 6 or more in overetching.

With the arrangement, since the energy of ion fluxes is surely lowered and the incidence directions of the ion fluxes are surely tilted from a perpendicular to the surface of the sample stage, high selectivity can be achieved in overetching.

When a terminate signal was outputted from a terminal detector which outputs the terminate signal upon detecting the termination of main etching, the value of (pressure of reactive gas)/(frequency of high-frequency power) is preferably changed.

With the arrangement, since P/f is switched by the terminate signal outputted from the terminal detector, the magnitude of the energy of ion fluxes and the incidence directions thereof can surely be switched in main etching and in overetching, so that switching between the operation mode for main etching and the operation mode for overetching can surely be accomplished.

Preferably, the value of (pressure of reactive gas)/(frequency of high-frequency power) is changed when a predetermined period of time elapsed. Thus, switching from the main etching operation mode to the overetching operation mode can surely be accomplished based on a predetermined program.

Preferably, the frequency of the high-frequency power in main etching is set at a value equal to or higher than 10 MHz. With the arrangement, the level of the frequency of the high-frequency power becomes one-dimensionally proportional to the magnitude of the energy of ion fluxes arriving at the sample stage.

Preferably, the pressure of the reactive gas in main etching is set at a value equal to or lower than 20 Pa. With the arrangement, the proportional relationship among the level of the frequency of the high-frequency power, the magnitude of the energy of the ion fluxes arriving at the sample stage, and perpendicularity of the incidence directions thereof becomes obvious.

Preferably, the frequency of the high-frequency power in overetching is set at a value over about one fifth of the frequency of the high-frequency power in main etching and under the frequency of the high-frequency power in main etching. With the arrangement, since the high-frequency power in overetching becomes a value over about one twenty-fifth of the frequency of the high-frequency power in main etching and under the frequency of the high-frequency power in main etching, a burden on the high-frequency power source can be reduced.

In the case of applying the above plasma generating and processing method to thin-film forming technology, the process performed by the ions with respect to the sample on the sample stage is thin-film forming process and the plasma processing step further comprises the step of increasing the value of (pressure of reactive gas)/(frequency of high-frequency power) and the scattering probability in main thin-film formation, thereby reducing the energy of the ion fluxes and tilting the incidence directions of the ion fluxes from a perpendicular to a surface of the sample stage, while reducing the value of (pressure of reactive gas)/(frequency of high-frequency power) and the scattering probability in step coverage improvement, thereby increasing the energy of the ion fluxes and making the incidence directions of the ion fluxes perpendicular to the surface of the sample stage.

With the arrangement, since P/f and the scattering probability are high in main thin-film formation, the energy of ion fluxes is reduced and the incidence directions of the ion fluxes are tilted from a perpendicular to the surface of the sample stage, resulting in the formation of a uniform thin film. On the other hand, since P/f and the scattering probability are low in step coverage improvement, the energy of ion fluxes is raised and the ion fluxes are incident upon the sample stage in directions perpendicular to the surface thereof, thereby effectively removing thick portions of the deposited film at the upper edge corners of the concave portion at the surface of the sample. Consequently, a thin film with a uniform thickness can be formed easily and effectively on the surface of the sample with concave and convex portions with excellent step coverage.

Preferably, the value of (pressure of reactive gas)/ (frequency of high-frequency power) is increased and reduced in main thin-film formation and in step coverage improvement, respectively, by setting the frequency of the high-frequency power at a constant value both in main thin-film formation and in step coverage improvement and by increasing and reducing the pressure of the reactive gas in main thin-film formation and in step coverage improvement, respectively.

Thus, if P/f is changed by changing the pressure of the reactive gas while maintaining the frequency of the high-frequency power at a constant level, P/f can be changed by simple mechanical operation. On the other hand, if the pressure of the gas is increased, the formation of a thin film is promoted by an increased amount of radicals, so that the thin film can be formed efficiently.

Preferably, the value of (pressure of reactive gas)/ (frequency of high-frequency power) is increased and reduced in main thin-film formation and in step coverage improvement, respectively, by setting the pressure of the reactive gas at a constant value both in main thin-film formation and in step coverage improvement and by reducing and increasing the frequency of the high-frequency power in main thin-film formation and in step coverage improvement, respectively.

Thus, if P/f is changed by changing the frequency of the high-frequency power while maintaining the pressure of the reactive gas at a constant value, P/f can be changed stably in a short period of time, so that the operation mode can be changed without changing the chemical gas composition in the plasma.

Preferably, the value of (pressure of reactive gas)/ (frequency of high-frequency power) is increased and reduced in main thin-film formation and in step coverage improvement, respectively, by increasing the pressure of the reactive gas and reducing the frequency of the high-frequency power in main thin-film formation and by reducing the pressure of the reactive gas and increasing the frequency of the high-frequency power in step coverage improvement.

Thus, if P/f is changed by simultaneously changing the pressure of the reactive gas and the frequency of the high-frequency power, not only P/f but also the operation mode can be changed without causing a significant variation in each of the pressure of the reactive gas and the frequency of the high-frequency power, thereby reducing a variation in the gas composition in the plasma and a burden on the high-frequency power source.

Preferably, the value of (pressure of reactive gas)/ (frequency of high-frequency power) is changed in main thin-film formation and in step coverage improvement so that the scattering probability in main thin-film formation becomes equal to or more than 1.5 times the scattering probability in step coverage improvement. With the arrangement, since the energy of ions in step coverage improvement is raised and the removal of thick portions of the film at the upper edge corners of a concave portion at the surface of the sample is promoted, step coverage improvement can be accomplished efficiently.

If the scattering probability is defined as (length of sheath region on sample-stage side)/(mean free path of ions in sheath region on sample-stage side), the value of (pressure of reactive gas)/(frequency of high-frequency power) is determined so that the value of the scattering probability becomes 6 or more in main thin-film formation. With the arrangement, the energy of the ions fluxes is surely reduced and the incidence directions of the ion fluxes with respect to the sample stage are surely tilted from a perpendicular to the surface thereof, so that a thin film with a uniform thickness can be formed over the surface of the sample with concave and convex portions.

If the scattering probability is defined as (length of sheath region on sample-stage side)/(mean free path of ions in sheath region on sample-stage side), the value of (pressure of reactive gas)/(frequency of high-frequency power) is determined so that the value of the scattering probability becomes 6 or less in step coverage improvement. With the arrangement, the energy of ion fluxes is surely increased and the ion fluxes are surely incident upon the sample stage in directions perpendicular to the surface thereof, so that the removal of thick portions of the deposited film at upper edge corners of a concave portion at the surface of the sample is promoted, thereby efficiently accomplishing step coverage.

Preferably, the value of (pressure of reactive gas)/ (frequency of high-frequency power) is changed when a predetermined period of time elapsed. With the arrangement, switching from the main thin-film forming operation mode to the step coverage operation mode can surely be accomplished based on a predetermined program.

Preferably, the frequency of the high-frequency power is set to a value equal to or higher than 10 MHz. With the arrangement, the level of the frequency of the high-frequency power becomes one-dimensionally proportional to the magnitude of the energy of ion fluxes arriving at the sample stage.

Preferably, the pressure of the reactive gas is set to a value equal to or lower than 20 Pa. With the arrangement, the proportional relationship among the level of the frequency of the high-frequency power, the energy of ions fluxes arriving at the sample stage, and the perpendicularity of the incidence directions thereof becomes obvious.

Preferably, the frequency of the high-frequency power in step coverage improvement is set to a value equal to or less than about five times the frequency of the high-frequency power in main thin-film formation. With the arrangement, since a variation in the high-frequency power caused by a variation in its frequency can be reduced by twenty-five times or less, a burden on the high-frequency power source can be reduced.

The plasma generating and processing apparatus comprises: a main unit of the apparatus having a vacuum chamber, a sample stage disposed in the vacuum chamber so that a sample is disposed thereon, a gas introducing means for introducing a reactive gas into the vacuum chamber, a plasma generating means for generating a plasma of the reactive gas in the vacuum chamber, and a high-frequency power supplying means for applying high-frequency power to the sample stage so that ions in the plasma are made incident upon the sample stage and perform process with respect to the sample on the sample stage; and a control means for changing a value of (pressure of reactive gas)/ (frequency of high-frequency power) so as to change a scattering probability which is the probability of the ions being scattered in collision with neutral particles in a sheath region on the side of the sample stage.

With the apparatus, P/f can surely be changed with ease.

In the case of applying the above plasma generating and processing apparatus to dry etching process, it is preferable that the main unit of the apparatus is for performing dry etching process with respect to the sample on the sample stage and that the control means has a means for controlling the gas introducing means so that, in main etching, the value of (pressure of reaction gas)/(frequency of high-frequency power) is reduced and the scattering probability is reduced, thereby increasing the energy of the fluxes of the ions and making the incidence directions of the ion fluxes perpendicular to a surface of the sample stage and that, in overetching, the value of (pressure of reactive gas)/(frequency of high-frequency power) is increased and the scattering probability is increased, thereby reducing the energy of the fluxes of the ions and tilting the incidence directions of the ion fluxes from a perpendicular to the surface of the sample stage.

Preferably, the control means has a means for controlling the high-frequency power supplying means so that, in main etching, the value of (pressure of reactive gas)/(frequency of high-frequency power) is reduced and the scattering probability is reduced, thereby increasing the energy of the fluxes of the ions and making the incidence directions of the ion fluxes perpendicular to a surface of the sample stage and that, in overetching, the value of (pressure of reactive gas)/(frequency of high-frequency power) is increased and the scattering probability is increased, thereby reducing the energy of the fluxes of the ions and tilting the incidence directions of the ion fluxes from a perpendicular to the surface of the sample stage.

Preferably, the control means has a means for simultaneously controlling the gas introducing means and the high-frequency power supplying means so that, in main etching, the value of (pressure of reactive gas)/(frequency of high-frequency power) is reduced and the scattering probability is reduced, thereby increasing the energy of the fluxes of the ions and making the incidence directions of the ion fluxes perpendicular to a surface of the sample stage and that, in overetching, the value of (pressure of reactive gas)/(frequency of high-frequency power) is increased and the scattering probability is increased, thereby reducing the energy of the fluxes of the ions and tilting the incidence directions of the ion fluxes from a perpendicular to the surface of the sample stage.

With the arrangement, since P/f and the scattering probability are low in main etching, the energy of the ion fluxes is increased and the ion fluxes are incident upon the sample stage in directions perpendicular to the surface thereof, vertical etch profiles can be defined at a high etching rate. On the other hand, since P/f and the scattering probability are also high in overetching, the energy of ion fluxes is reduced and the incidence directions of the ion fluxes are tilted from a perpendicular to the surface of the sample stage, so that high selectivity to the underlying material can be achieved.

In the case of applying the above plasma generating and processing apparatus to thin-film forming process, it is preferable that the main unit of the apparatus is for performing thin-film forming process with respect to the sample on the sample stage and that the control means has a means for controlling the gas introducing means so that, in main thin-film formation, the value of (pressure of reactive gas)/(frequency of high-frequency power) is increased and the scattering probability is increased, thereby reducing the energy of the fluxes of the ions and tilting the incidence directions of the ion fluxes from a perpendicular to a surface of the sample stage and that, in step coverage improvement, the value of (pressure of reactive gas)/(frequency of high-frequency power) is reduced and the scattering probability is reduced, thereby increasing the energy of the fluxes of the ions and making the incidence directions of the ion fluxes perpendicular to the surface of the sample stage.

Preferably, the control means has a means for controlling the high-frequency power supplying means so that, in main thin-film formation, the value of (pressure of reactive gas)/(frequency of high-frequency power) is increased and the scattering probability is increased, thereby reducing the energy of the fluxes of the ions and tilting the incidence directions of the ion fluxes from a perpendicular to a surface of the sample stage and that, in step coverage improvement, the value of (pressure of reactive gas)/(frequency of high-frequency power) is reduced and the scattering probability is reduced, thereby increasing the energy of the fluxes of the ions and making the incidence directions of the ion fluxes perpendicular to the surface of the sample stage.

Preferably, the control means has a means for simultaneously controlling the gas introducing means and the high-frequency power supplying means so that, in main thin-film formation, the value of (pressure of reactive gas)/(frequency of high-frequency power) is increased and the scattering probability is increased, thereby reducing the energy of the fluxes of the ions and tilting the incidence directions of the ion fluxes from a perpendicular to a surface of the sample stage and that, in step coverage improvement, the value of (pressure of reactive gas)/(frequency of high-frequency power) is reduced and the scattering probability is reduced, thereby increasing the energy of the fluxes of the ions and making the incidence directions of the ion fluxes perpendicular to the surface of the sample stage.

With the arrangement, since P/f and the scattering probability are also high in main thin-film formation, the energy of the ion fluxes is reduced and the incidence directions of the ion fluxes are tilted from a perpendicular to the surface of the sample stage, resulting in the formation of a thin film with a uniform film thickness. On the other hand, since P/f and the scattering probability are low in step coverage improvement, the energy of ion fluxes is raised and the ion fluxes are incident upon the sample stage in directions perpendicular to the surface thereof, resulting in efficient step coverage improvement.

Preferably, the control means has a means for controlling the gas introducing means and the high-frequency power supplying means so that, when a predetermined period of time elapsed, the value of (pressure of reactive gas)/(frequency of high-frequency power) is changed. With the arrangement, the operation mode can surely be switched based on a predetermined program.

BRIEF DESCRIPTION OF THE DRAWINGS

FIGS. 2(a) to 2(c) are views each showing a one-dimensional distribution of a physical quantity of a plasma generated between an anode and a sample stage in the above parallel-plate reactive ion dry etching apparatus, of which FIG. 2(a) shows the density distribution of electrons, FIG. 2(b) shows the density distribution of ions, and FIG. 2(c) shows the density distribution of ions fluxes;

FIGS. 3(a) to 3(c) are views each showing a one-dimensional distribution of a physical quantity of the plasma generated on the side of the sample stage in the above parallel-plate reactive ion dry etching apparatus, of which FIG. 3(a) shows the potential distribution of the plasma, FIG. 3(b) shows the distribution of an electric field, and FIG. 3(c) shows the temperature distribution of electrons;

FIGS. 4(a) to 4(c) are views each showing the dependence of a physical quantity on the frequency of high-frequency power applied to the sample stage in the above parallel-plate reactive ion dry etching apparatus, of which FIG. 4(a) shows, as the physical quantity, the maximum value of ion density, FIG. 4(b) shows the maximum and minimum values of the ion fluxes travelling to the sample stage, and FIG. 4(c) shows the maximum and minimum values of the length of a sheath region between the anode and the sample stage;

FIG. 6 is a view diagrammatically showing ions, having started from the boundary region between a bulk plasma region and the sheath region, are travelling toward the sample stage in the sheath region, while being scattered in collision with neutral particles;

FIG. 7 is a view showing the dependence of the energy of ions on the frequency when they are arriving at the sample stage in the above parallel-plate reactive ion dry etching apparatus;

FIGS. 8(a) to 8(c) are views each showing the dependence of a physical quantity on gas pressure in the above parallel-plate reactive ion dry etching apparatus, of which FIG. 8(a) shows, as the physical quantity, the maximum value of the density of ions, FIG. 8(b) shows the maximum and minimums values of ion fluxes travelling to a cathode, and FIG. 8(c) shows the maximum and minimum values of the length of the sheath region on the side of the sample stage;

FIG. 9 is a view showing, by way of example, a method of switching an etching operating mode in two dimensions of the gas pressure and the frequency;

FIGS. 12(a) and 12(b) show etching performed with respect to a polysilicon gate doped with phosphorus by means of the above parallel-plate reactive ion dry etching apparatus, of which FIG. 12(a) shows the state under the conditions of a main etching mode and FIG. 12(b) shows the state under the conditions of an overetching mode;

FIGS. 13(a) and 13(b) show etching performed with respect to the polysilicon gate doped with phosphorus by means of a conventional parallel-plate reactive ion dry etching apparatus, of which FIG. 12(a) shows the state under the conditions of the main etching mode and FIG. 12(b) shows the state under the conditions of the overetching mode;

FIGS. 15(a) to 15(c) are views illustrating etching performed with respect to polysilicon doped with phosphorus by means of the conventional magnetron etching apparatus, of which FIG. 15(a) shows the state of etching, FIG. 15(b) shows the intensity of a magnetic field, and FIG. 15(c) shows an etching rate;

FIGS. 16(a) and 16(b) are views illustrating the process of etching with respect to the polysilicon doped with phosphorus by means of the above parallel-plate reactive ion dry etching apparatus, of which FIG. 16(a) shows the state of etching and FIG. 16(b) shows an etching rate;

FIGS. 19(a) and 19(b) are views illustrating thin-film formation in forming a TEOS film on the surface of Al wiring, of which FIG. 19(a) shows the operation mode in main thin-film formation and 19(b) shows the operation mode in step coverage improvement.

DETAILED DESCRIPTION OF THE PREFERRED EMBODIMENTS

Below, a parallel-plate reactive ion dry etching apparatus according to a first embodiment of the present invention will be described with reference to the drawings.

Figure 1:
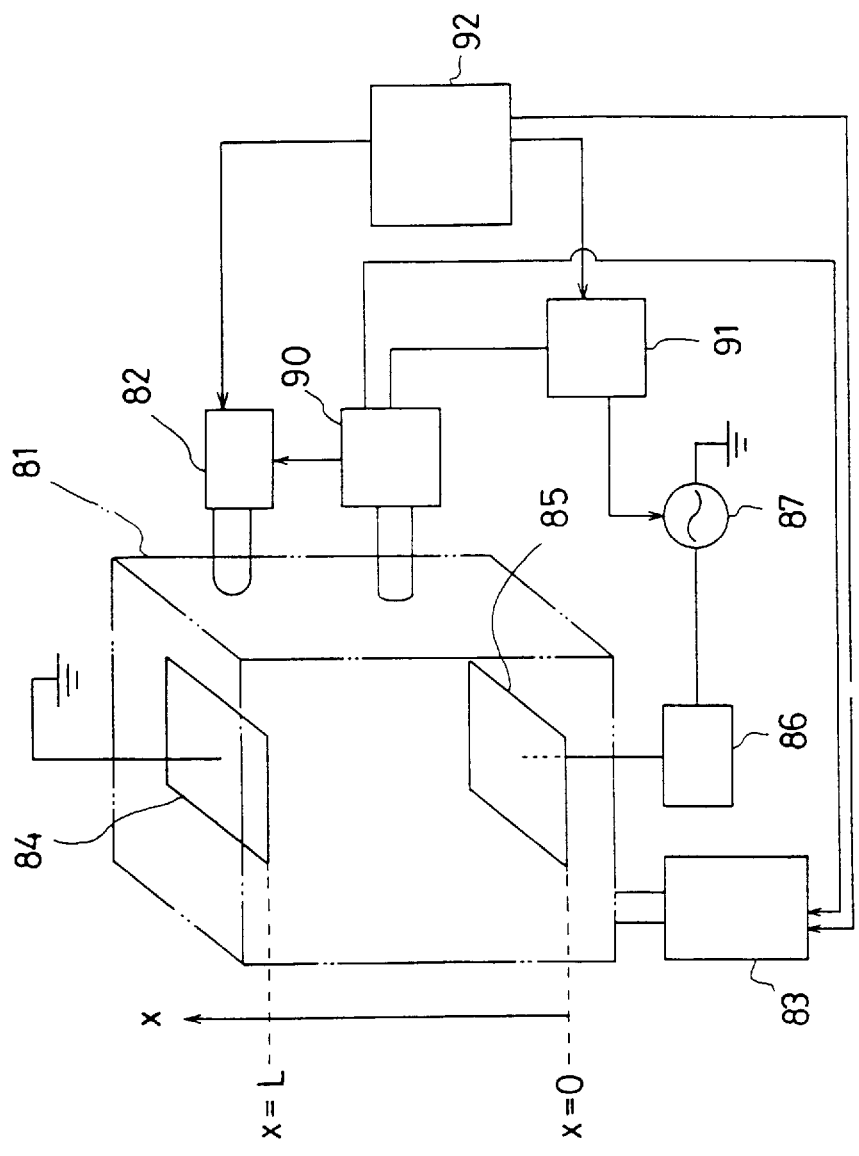
FIG. 1 is a view schematically showing the overall structure of a parallel-plate reactive ion dry etching apparatus according to a first embodiment of the present invention.

FIG. 1 is a view schematically showing the structure of the parallel-plate reactive ion dry etching apparatus, in which a reactive gas is introduced into a metal chamber 81 via a gas controller 82 serving as a gas introducing means, while the pressure in the chamber 81 is controlled at a proper value by a gas discharge system 83. In the upper part of the chamber 81 is disposed an anode electrode 84, while a sample stage 85 serving as a cathode electrode is disposed in the lower part thereof.

To the sample stage 85 is connected a high-frequency power source 87 as a high-frequency power supplying means capable of changing a frequency via an impedance matching circuit 86, so that high-frequency discharge can be caused between the sample stage 85 and the anode electrode 84. The frequency of the high-frequency power source 87 can be changed by a frequency control circuit 91.

The terminal of etching can be detected by an etching terminal detector 90 using a spectral method. At the termination of etching, the etching terminal detector 90 outputs a terminate signal, which controls the gas controller 82 and the gas discharge system 83, so that the gas pressure in the chamber 81 is controlled. The terminate signal also controls the frequency of the high-frequency power source 87 via the frequency control circuit 91.

It is also possible to control the gas controller 82, gas discharge system 83, and frequency control circuit 91 by means of a program control apparatus 92 in accordance with a processing flow that has previously been programmed.

Figure 2A:
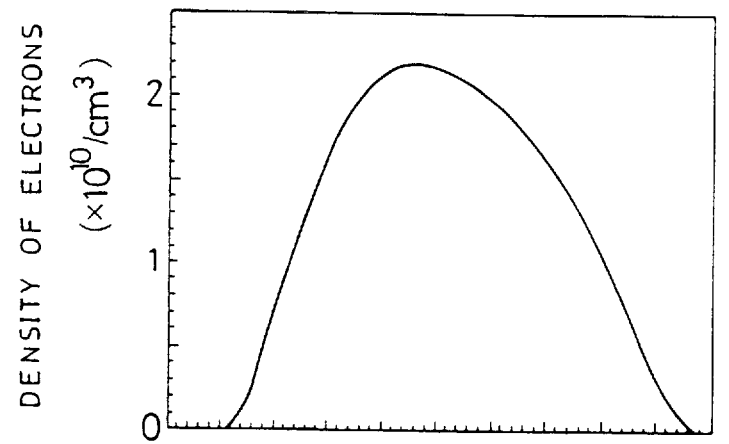
Figure 2B:
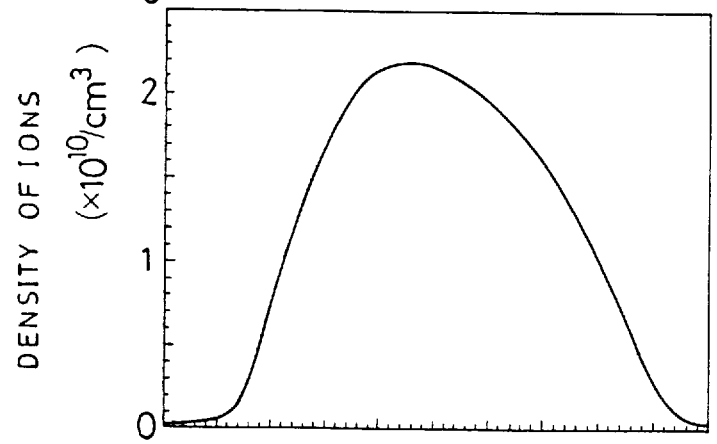
Figure 2C:
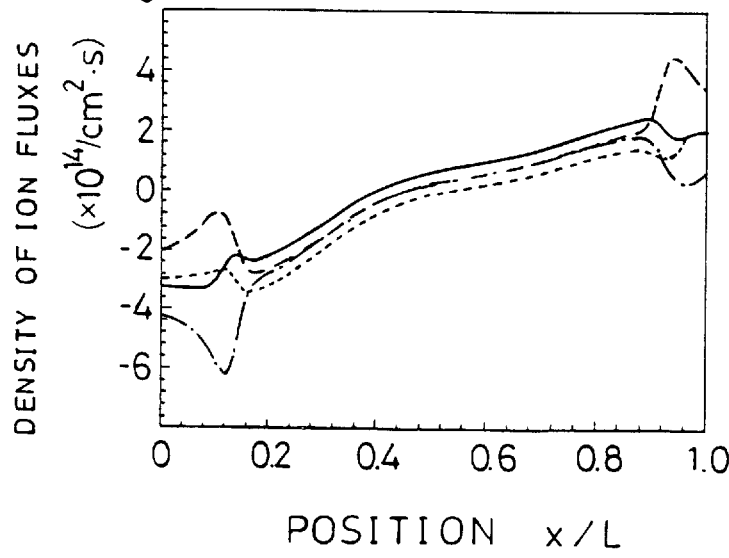

FIGS. 2(a) to 2(c) and FIGS. 3(a) to 3(c) show one-dimensional distributions of physical quantities of a plasma generated between the anode electrode 84 and the sample stage (cathode) 85 in the parallel-plate reactive ion dry etching apparatus. That is, FIG. 2(a) shows the density distribution of electrons, FIG. 2(b) shows the density distribution of ions, FIG. 2(c) shows the density distribution of ion fluxes, FIG. 3(a) shows the potential distribution of the plasma, FIG. 3(b) shows the distribution of an electric field, and FIG. 3(c) shows the temperature distribution of electrons. In FIGS. 2 and 3, the horizontal axes represent relative positions with respect to the distance L between the anode electrode 84 and the sample stage 85, while x/L=0 corresponds to the position of the sample stage 85 and x/L=1 corresponds to the position of the anode electrode 84. In FIGS. 2 and 3, graphs corresponding to the respective quarters of one cycle $\tau_{RF}$ of the high-frequency power are represented by different types of lines. In the vicinity of the sample stage 85, a self-bias is formed by the high-frequency power applied to the sample stage 85. The sample stage 85 is negatively charged as shown in FIG. 3(a), while an intense electric field perpendicular to the sample stage 85, so-called an ion sheath, is formed as shown in FIG. 3(b). Consequently, the density of electrons substantially becomes zero because negatively charged electrons are repelled in the sheath region on the side of the sample stage 85, while positive ions are travelling to the sample stage 85 in such a manner that they are accelerated toward the sample stage 85.

FIGS. 4(a) to 4(c) show the maximum value of the density of ions, the maximum and minimum values $F_{max}$ and $F_{min}$ of the density of ions fluxes travelling to the sample stage 85, and the maximum and minimum values $d_{max}$ and $d_{min}$ of the length of the sheath region in the case where the frequency of the high-frequency power applied to the sample stage 85 is changed. The length of the sheath region represents the value in %, which has been normalized for the inter-electrode distance L surrounded by the anode electrode 84 and the sample stage 85. It can be appreciated from FIGS. 4(a) to 4(c) that the density of ions travelling to the sample stage 85 and the maximum and minimum values $F_{max}$ and $F_{min}$ of the density of ion fluxes simply increase with an increase in frequency, while the maximum and minimum values $d_{max}$ and $d_{min}$ of the length of the sheath region decrease with an increase in frequency in such a manner that they are inversely proportional to the square root of the frequency.

Figure 5:
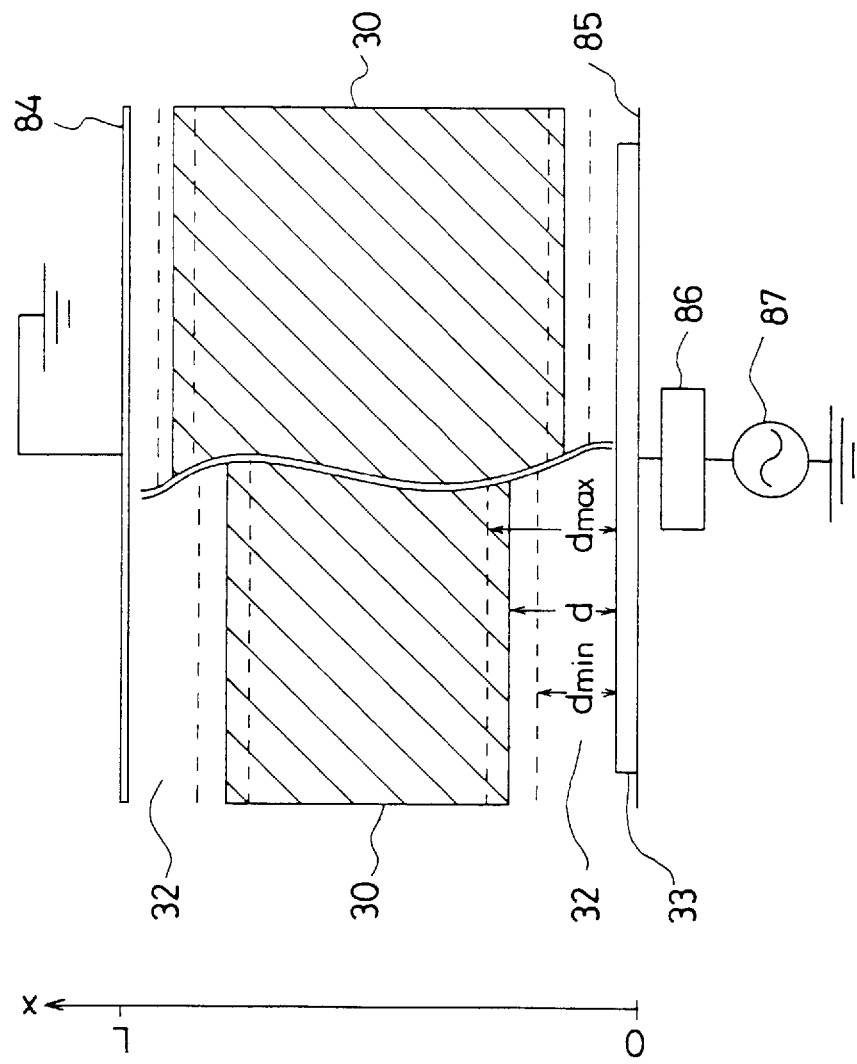
FIG. 5 is a view diagrammatically showing the dependence of the length of the sheath region on the frequency in the above parallel-plate reactive ion dry etching apparatus, of which the left half shows a case where the frequency is relatively low and the right half shows the case where the frequency is relatively high.

FIG. 5 shows the dependence of the sheath on the frequency shown in FIG. 4 above a cross-sectional diagram of the parallel-plate reactive ion etching apparatus. That is, the left part of FIG. 5 shows the case where the frequency is comparatively low, while the right half thereof shows the case where the frequency is comparatively high. Over one cycle $\tau_{RF}$ of the high-frequency power, the length of the sheath region varies centering around its mean value d between the maximum and minimum values $d_{max}$ and $d_{min}$ inclusive. If the frequency is comparatively high, the length d of the sheath region becomes shorter than that obtained if the frequency is comparatively low. That region other than the sheath region of a plasma generation region surrounded by the anode electrode 84 and the sample stage 85 is generally termed a bulk plasma region.

As shown in FIG. 6, ions having started from the boundary region between the bulk plasma region and the sheath region are scattered in collision with neutral particles, while they are accelerated in the sheath region toward the sample stage 85, so that the direction of their travel is disturbed and their energy decays. As a result, under a constant pressure of the reactive gas, the number of times that the ions are scattered in collision with the neutral particles is reduced with a comparatively high frequency with which the length d of the sheath region becomes smaller than with a comparatively low frequency with which the length d of the sheath region is increased, so that a large number of ion fluxes are perpendicularly incident upon the sample stage 95 at high energy. Under a constant pressure of the reactive gas, on the other hand, the number of times that the ions are scattered in collision with the neutral particles with a comparatively low frequency with which the length d of the sheath region is increased becomes larger than with a comparatively high frequency with which the length d of the sheath region is reduced, so that the density of ion fluxes is lowered as well as the energy of the ions is reduced.

FIG. 7 shows the dependence of the energy of ions arriving at the sample stage 85 on the frequency. Briefly, in a low-frequency region A on the order of 10 MHz or less, the energy of the ions increases with the lowering of the frequency for the following reason. That is, a distance traveled by the ions and electrons in one cycle is increased with the lowering of the frequency, so that a loss of ions in a plasma discharge region is increased. To sustain the discharge by compensating for the loss, it is necessary to sufficiently increase the frequency of collisions between the ions and the electrons. In other words, although secondary electrons are generated by collisions between the ions and the cathode electrode, it is necessary for the secondary electrons to promptly enter the bulk plasma region through the high electric field region in the sheath region. To accomplish this, the inter-sheath voltage is inevitably increased at the same time as the frequency is lowered, resulting in an increase in the energy of ions. On the other hand, the energy of ions is increased with an increase in frequency in a high-frequency region B on the order of 10 MHz or higher for the following reason. As described above, the number of times that the ions are scattered in collision with the neutral particles becomes smaller with an increase in frequency, so that the energy decay of ions is suppressed. Therefore, it is desirable to perform plasma processing in the high-frequency region B in which the frequency is on the order of 10 MHz or higher.

FIGS. 8(a) to 8(c) show the maximum value of the density of ions, the maximum and minimum values $F_{max}$ and $F_{min}$ of the density of ion fluxes travelling to the sample stage 85, and the maximum and minimum values $d_{max}$ and $d_{min}$ of the length of the sheath region in the case where the pressure of the reactive gas is changed in the parallel-plate reactive ion dry etching apparatus shown in FIG. 1. It can be appreciated from FIGS. 8(a) to 8(c) that the maximum value of the density of ions travelling to the sample stage 85 and the maximum and minimum values $F_{max}$ and $F_{min}$ of the density of ions fluxes increase with an increase in gas pressure, while the length of the sheath region decreases with an increase in gas pressure in a manner inversely proportional to the square root of the gas pressure.

From the above description, it can be deduced that the length d of the sheath region formed in the vicinity of the sample stage 85 is represented by $d \sim K_1/(P \cdot f)^{1/2}$, since it is substantially proportional to the reciprocals of the respective square roots of the pressure P of the reactive gas introduced into the chamber 81 and of the frequency f of the high-frequency power applied to the sample stage 85.

Since the mean free path $\lambda$ of ions primarily resulting from the scattering of the ions in elastic collision with the neutral particles and from the scattering of the ions due to charge exchange is inversely proportional to the gas pressure P, it can be represented by $\lambda = K_2/P$.

On the other hand, a scattering probability $\eta$, which is the probability of the ions having started from the boundary region between the bulk plasma region and the sheath region being scattered in collision with the neutral particles in the sheath region while they are travelling to the sample stage 85, is represented by $\eta = d/\lambda$. By substituting the expressions for d and $\lambda$ into the expression for $\eta$, the following relational expression can be obtained:

$$\eta = d/\lambda \sim (K_1/(P \cdot f)^{1/2}) \times (P/K_2)$$

$$= (K_1/K_2) \times (P/f)^{1/2} = K_3 \times (P/f)^{1/2}$$

where each of $K_1$, $K_2$, and $K_3 = K_1/K_2$ is a constant.

From the foregoing findings, the following conclusion can be drawn. That is, if the gas pressure P and the frequency f are increased, the length d of the sheath region, which is the distance travelled by the ions having started from the boundary region between the bulk plasma region and the sheath region and moving toward the sample stage 85, is reduced so that the probability of the ions colliding with the neutral particles is also reduced from this point of view. If the gas pressure P is raised, the mean free path λ of the ions is reduced, so that the probability of the ions colliding with the neutral particles is increased from this point of view. From the above expression for η, it can be understood that P/f can be reduced by lowering the gas pressure P and increasing the frequency f, resulting in a reduction in the scattering probability η of the ions being scattered in collision with the neutral particles in the sheath region, which suppresses the energy decay of the ions. Consequently, it becomes possible to make the ions incident upon the sample stage 85 in directions substantially perpendicular to a surface thereof. Moreover, since the density decay of the ion fluxes arriving at the sample stage 85 can be suppressed, throughput in etching can be increased as well as sufficiently anisotropic etching can be performed. In main etching, the foregoing requirements should be satisfied.

On the other hand, if the gas pressure P and the frequency f are reduced, the length d of the sheath region is increased, so that the probability of collisions between the ions and the neutral particles is increased from this point of view. If the gas pressure P is reduced, the mean free path λ of the ions is increased, so that the probability of collisions between the ions and the neutral particles is reduced from this point of view. From the above expression for η, it can be understood that P/f can be increased by raising the gas pressure P and reducing the frequency f, resulting in an increase in the scattering probability η of the ions being scattered in collision with the neutral particles in the sheath region, which results in the energy decay of the ions. Consequently, it becomes possible to vary the incidence angles of the ions with respect to the sample stage 85 and to reduce the density of ions fluxes arriving at the sample stage 85, so that the etching ability is reduced. In overetching, the etching of the underlying material is restrained by satisfying these requirements, thereby increasing the etching selectivity to the underlying material.

Therefore, ideal etching can be performed by lowering the gas pressure P and increasing the frequency f in main etching so as to reduce P/f and by raising the gas pressure P and reducing the frequency f in response to the terminate signal outputted from the etching terminal detector 90 disposed in the chamber 81 so as to increase P/f.

FIG. 9 illustrates a specific method of switching the etching operation mode in a two-dimensional space of the gas pressure P and the frequency f. In FIG. 9, the broken curves represent a locus on which the length d of the sheath region is $K_1$ and a locus on which the length d of the sheath region is one fourth of $K_1$. The three lines passing through the origin represent loci on which the scattering probabilities η of the ions scattered in collision with the neutral particles in the sheath region are (½)$K_3$, $K_3$, and 2$K_3$, respectively.

Figure 10:
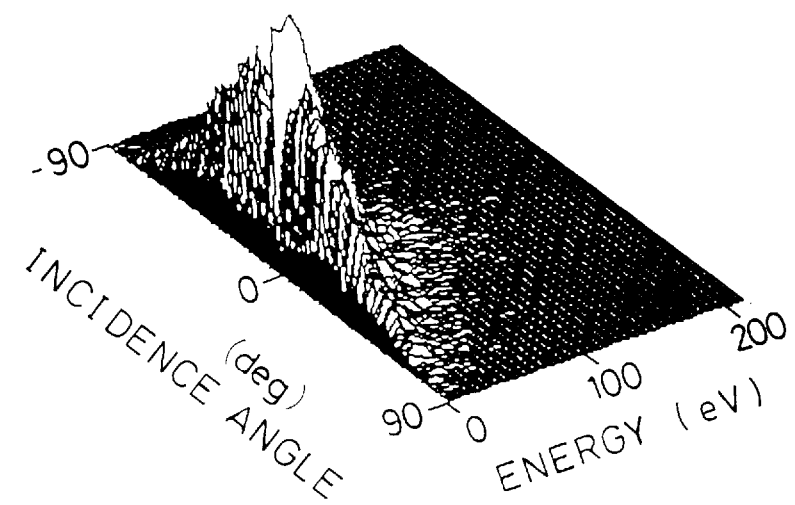
FIGS. 10(a) and 10(b) are views each showing angles at which ions are arriving at the sample stage and the energy distribution thereof corresponding to points in the two-dimensional space of the gas pressure P and the frequency f shown in FIG. 9, of which FIG. 10(a) corresponds to the point A in FIG. 9 and FIG. 10(b) corresponds to the point B in FIG. 9.
Figure 10:
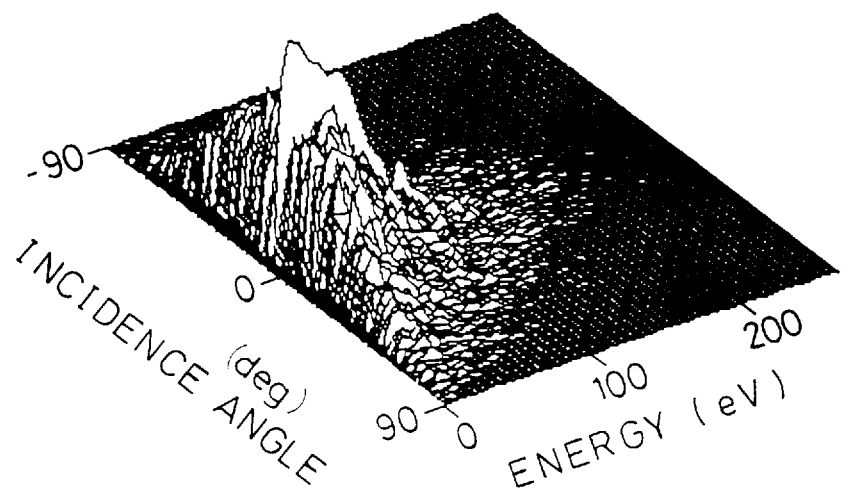

Before giving a description to a specific operation method, a description will be given to the distribution of ions at a representative point in the two-dimensional space of the gas pressure P and the frequency f. FIGS. 10(*a*) and 10(*b*) and FIGS. 11(*a*) and 11(*b*) show the incidence angles of the ion fluxes arriving at the sample stage 85 and the energy distributions thereof, which correspond to the points A, B, C and D in the two-dimensional space of the gas pressure P and the frequency f shown in FIG. 9, respectively. Here, the incidence angles represent angles tilted from directions perpendicular to a surface of the sample stage 85, so that the zero incidence angle indicates that the ions are incident upon the sample stage 85 in directions perpendicular to the surface thereof. Here, the dc self-bias voltage formed in the sheath region in the vicinity of the sample stage 85 is 250 V.

In the distribution of ions of FIG. 10(*a*) corresponding to the point A in FIG. 9, it is observed that the ions are satisfactorily scattered in collision with the neutral particles in the sheath region and incident upon the sample stage 85 over a wide range of angles. The energy distribution of ions is also localized on the lower energy side.

In the distribution of ions of FIG. 10(*b*) corresponding to the point B in FIG. 9, the length d of the sheath region is shorter than in the case of FIG. 10(*a*), so that the collisions between the ions and the neutral particles in the sheath region are slightly restrained and the energy distribution of ions has slightly expanded to the higher energy side. However, the scattering of the incidence directions of the ion fluxes is still remarkable and the incident ions are distributed over a wide range of angles.

Figure 11:
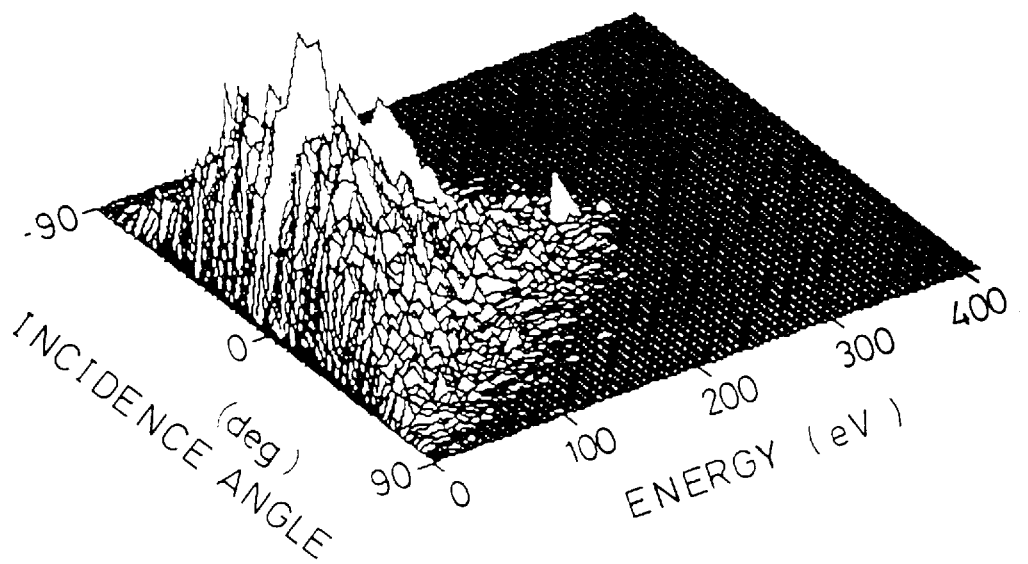
FIGS. 11(a) and 11(b) are views each showing angles at which ions are arriving at the sample stage and the energy distribution thereof corresponding to points in the two-dimensional space of the gas pressure P and the frequency f shown in FIG. 9, of which FIG. 11(a) corresponds to the point C in FIG. 9 and FIG. 11(b) corresponds to the point D in FIG. 9.
Figure 11:
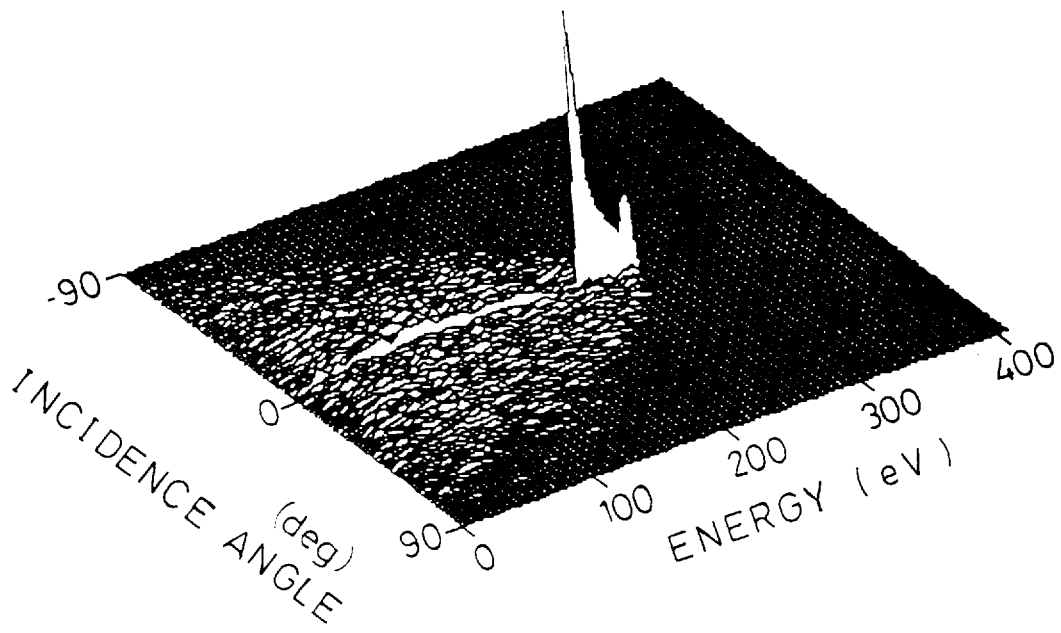

In the distribution of ions of FIG. 11(*a*) corresponding to the point C in FIG. 9, the length d of the sheath region is shorter than in the case of FIG. 10(*a*), so that the collisions between the ions and the neutral particles in the sheath region are restrained and the energy distribution of ions has expanded to the higher energy side. However, the scattering of the incidence directions of the ion fluxes is still remarkable and the incident ions are distributed over a wide range of angles.

In the distribution of ions of FIG. 11(*b*) corresponding to the point D in FIG. 9, the length d of the sheath region is shorter and the gas pressure P is lower than in the case of FIG. 10(*b*) or FIG. 11(*a*), so that the mean free path λ of ions is increased. As a result, the collisions between the ions and the neutral particles in the sheath region are satisfactorily reduced and the scattering of the incidence directions of the ion fluxes is satisfactorily restrained, thereby forming the distribution of incidence angles substantially perpendicular to a surface of the sample stage 85. As for the distribution of the energy of incident ions, it concentrates in the vicinity of 250 V corresponding to the self-bias voltage in so-called saddle structure, so that it can be understood that the energy decay of the ions in collision with the neutral particles is suppressed.

From the foregoing points of view, a description will be given to the method of switching the etching operation mode by using three examples. In a first method, a main etching operation mode is adopted under the conditions at the point D in FIG. 9 and then an overetching operation mode is adopted under the conditions at the point C in FIG. 9. In a second method, the main etching operation mode is adopted under the conditions at the point D in FIG. 9 and then the overetching operation mode is adopted under the conditions at the point B in FIG. 9. In a third method, the main etching operation mode is adopted under the conditions at the point D in FIG. 9 and then the overetching operation mode is adopted under the conditions of the point E in FIG. 9 by changing the frequency and the gas pressure at the same time.

FIGS. 12(*a*) and 12(*b*) diagrammatically shows the case where a polysilicon gate doped with phosphorus is etched in a parallel-plate reactive ion dry etching apparatus by using the above first method of switching the main etching operation mode to the overetching operation mode.

In the chamber 81 of the plasma generating apparatus is introduced 40 sccm of $Cl_2$ and 20 sccm of $SiCl_4$. The pressure in the chamber 81 is set to 10 Pa. The reactive gas may be composed of a gas containing another halogen gas, such as HBr or $SF_6$, as a main component. In FIGS. 12(a) and 12(b) are shown: a photoresist pattern 110; polysilicon 111 doped with phosphorus; a thermal oxide film 112; a silicon substrate 113; a deposited film 114 composed of a photoresist formed by sputtering during etching, $SiCl_4$ radicals, and a reaction product between silicon and the gas containing a halogen gas as a main component.

FIGS. 12(a) and 12(b) diagrammatically show etching in the main etching operation mode and etching in the overetching operation mode, respectively.

In the main etching operation mode, the gas pressure P is set to 10 Pa and the frequency f of the high-frequency power is set to 50 MHz. As a result, a loss of the generated plasma due to the collisions of the plasma with the wall of the chamber 81 is reduced, so that the density of ions is increased and the length of the sheath region is reduced, which reduces the number of times that the ions travelling in the sheath region are scattered in collision with the neutral particles. Consequently, the energy of ions arriving at the surface of the sample is increased, while the ion fluxes are incident upon the surface of the sample substantially perpendicular thereto. As a result, the rate of anisotropic etching such as ion-assisted etching is increased, so that etching with high throughput which provides vertical etch profiles is performed. In this case, the etching rate is 500 to 800 nm/min.

In the overetching operation mode, the gas pressure P is fixed at 10 Pa and the frequency f of the high-frequency power is reduced to 10 MHz. As a result, the length of the sheath region is increased and the number of times that the ions are scattered in collision with the neutral particles while they are travelling in the sheath region is increased, so that the energy of ions is reduced. At the same time, the ions are incident upon the surface of the sample at angles tilted from a perpendicular thereto so that etching with respect to the silicon dioxide film as an underlying material at the time when the silicon dioxide film is exposed is restrained by the action of the deposited film 114 consisting of: the photoresist formed on the silicon dioxide film formed by sputtering during etching; the $SiCl_4$ radicals; and the reaction product between silicon and the gas containing a halogen gas as a main component. In this case, the etching selectivity was 50 to 80.

FIGS. 13(a) and 13(b) diagrammatically show the case where the polysilicon gate doped with phosphorus is etched in the parallel-plate reactive ion etching apparatus by using a conventional method for switching the main etching operation mode to the overetching operation mode.

In this case also, 40 sccm of $Cl_2$ and 20 sccm of $SiCl_4$ are introduced into the chamber 81 of the plasma generating apparatus. The pressure in the chamber 81 is set to 10 Pa and the frequency of the high-frequency power to be applied to the sample stage 85 is set to 13.56 MHz.

FIGS. 13(a) and 13(b) diagrammatically show etching in the main etching operation mode and etching in the overetching operation mode, respectively.

The main etching operation mode has adopted a method in which the high-frequency power is set to 500 W in order to increase the rate of anisotropic etching, such as ion-assisted etching, and to achieve high throughput in processing, so that an inter-sheath voltage is increased, which in turn increases the energy of ions. On the other hand, the overetching operation mode has adopted a method in which the high-frequency power is reduced to 100 W in order to lower the energy of ions and to increase the etching selectivity to the silicon dioxide film, so that etching with respect to the underlying silicon dioxide film at the time when it is exposed is prevented by the deposited film consisting of: the thin photoresist film formed by sputtering on the silicon dioxide film; and the reaction product between silicon and the gas containing a halogen gas as its main component.

However, it is necessary to maintain the gas pressure at about 10 Pa or higher in order to cause discharge by means of the parallel-plate reactive ion dry etching. If the frequency of the high-frequency power is fixed at 13.56 MHz, as in the conventional method, the scattering probability of the ions being scattered in collision with the neutral particles in the sheath region is not sufficiently reduced, so that side walls are disadvantageously etched by the ions incident in slanting directions in the main etching operation mode and in the overetching operation mode, which renders the realization of vertical etch profiles difficult.

Figure 14:
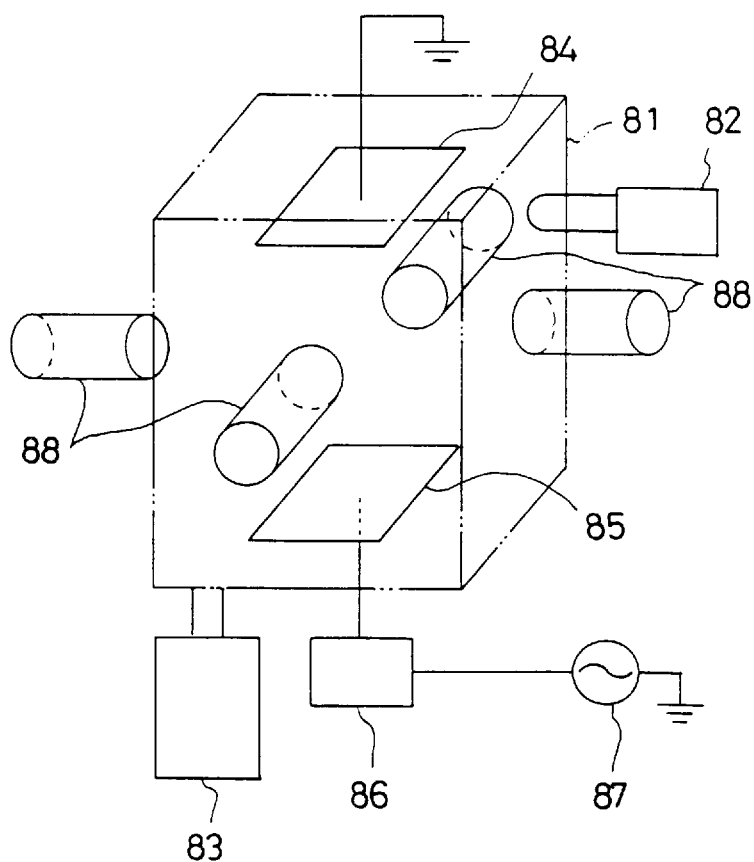
FIG. 14 is a view schematically showing the structure of a conventional magnetron etching apparatus.

To overcome the difficulty, the prior art has used a parallel-plate magnetron plasma generating apparatus as shown in FIG. 14, in which a rotating magnetic field is applied by two pairs of ac electromagnets 88 disposed on the side faces of the chamber 81, so that the ac electromagnets in one pair are opposed to the corresponding ac electromagnets in the other pair. Each of the ac electromagnets is phase shifted from an adjacent ac electromagnet by 90 degrees. With the arrangement, discharge is easily caused even at a comparatively low gas pressure on the order of 5 Pa or lower. Since the applied magnetic field causes electrons to make a cycloidal movement, the ionizing efficiency is increased.

Figure 15:
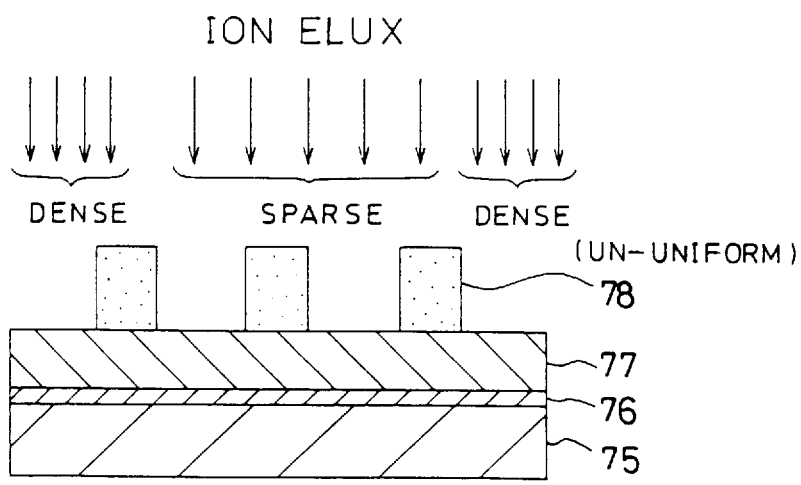
Figure 15:
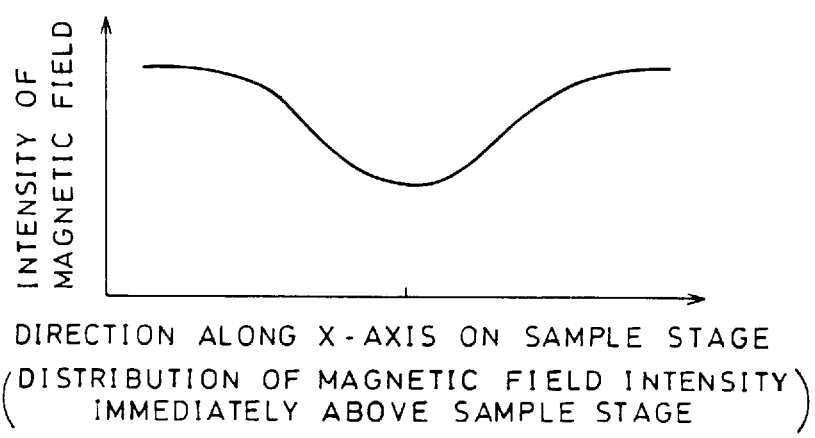
Figure 15:
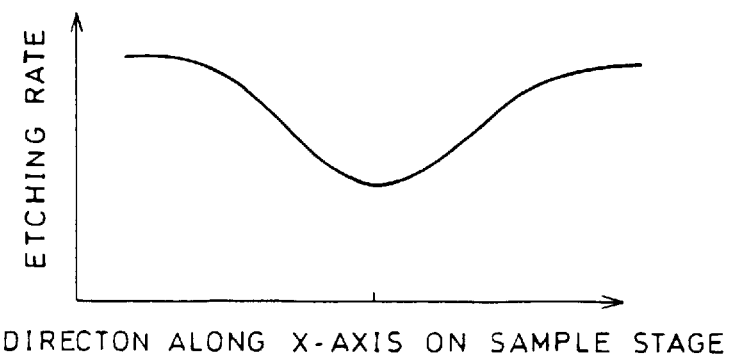

FIGS. 15(a) to 15(c) show etching performed with respect to the entire surface of the sample in accordance with the above conventional method. FIG. 15(a) diagrammatically shows the etching of a polysilicon film 77 doped with phosphorus by means of the magnetron etching apparatus using the rotating magnetic field. As shown in FIG. 15(b), if the distribution of the magnetic field intensity immediately above the sample stage at a certain moment has a minimum value at the center of the sample stage, the density of the ion fluxes incident upon the surface of the polysilicon film 77 is proportional to the density distribution of the plasma in accordance with the distribution of the magnetic field intensity, so that it becomes sparse at the center as shown in FIG. 15(a). Moreover, the rate of etching the polysilicon film varies in accordance with the density of ion fluxes, so that it is not constant. An un-uniform plasma density causes a damage associated with the localization of charges.

Figure 16:
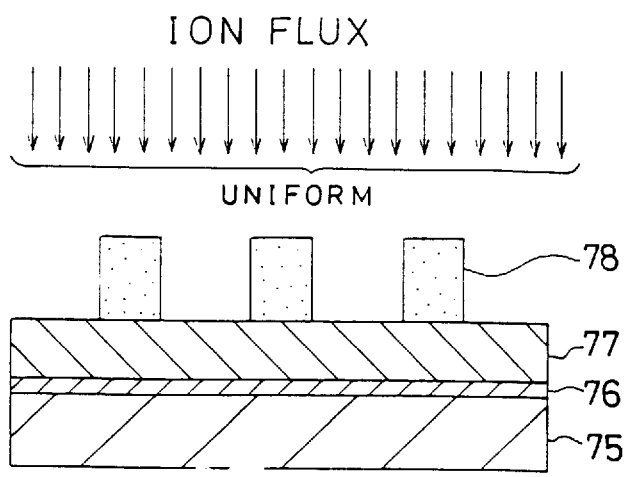
Figure 16:
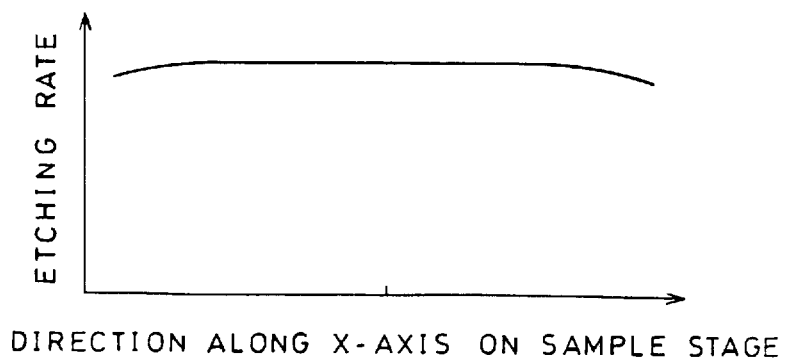
Figure 17:
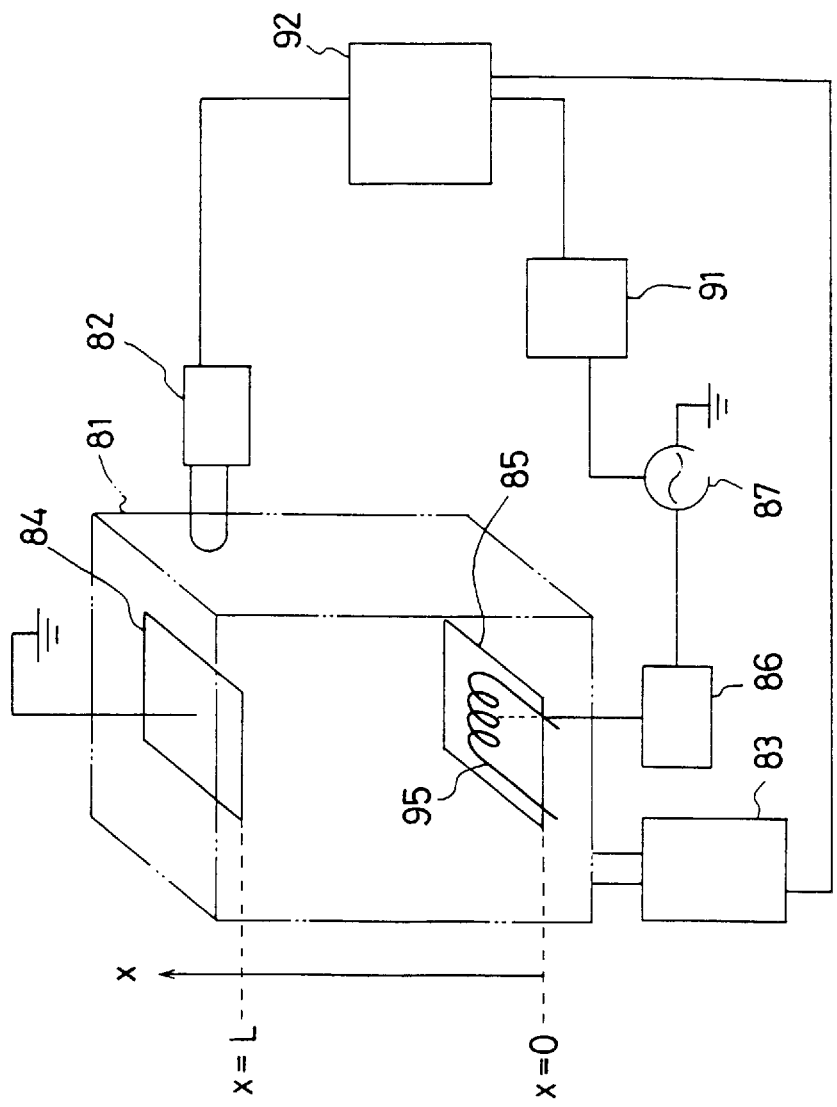
FIG. 17 is a view schematically showing the overall structure of a CVD thin-film forming and processing apparatus according to a second embodiment of the present invention.

FIGS. 16(a) and 16(b) show etching performed with respect to the entire surface of the sample in accordance with the etching process method according to the present invention. As shown in FIG. 16(a), the plasma density and the distribution of the ion fluxes become substantially uniform in the entire region processed by the plasma. The reaction product resulting from the reactive gas for etching is directed to the entire surface of the sample substantially uniformly. Consequently, the etch features also become uniform in the entire region of the sample and the damage due to charge-up is significantly reduced. Moreover, the plasma density as well as the etching rate are high.

As a result, if the plasma generating and processing method of the present invention is applied to etching process techniques, even under an intermediate gas pressure of about 10 Pa, high throughput in processing as well as sufficiently anisotropic etching can be achieved in main etching, while high selectivity to the underlying material can be obtained in overetching with high precision by switching the frequency to another value. Moreover, these effects can be achieved by the parallel-plate ion dry etching apparatus of simple structure in which an un-uniform plasma density is negligible, so that the etch features become uniform in the entire region of the sample, thereby significantly reducing the damage resulting from charge-up.

The excellent etching characteristics obtained in the first method can similarly be obtained even if the second method is used in which the main etching operation mode is adopted under the conditions at the point D in FIG. 9 and then the overetching operation mode is adopted under the conditions at the point B in FIG. 9 or even if the third method is used in which the main etching operation mode is adopted under the conditions at the point D in FIG. 9 and then the overetching operation mode is adopted under the conditions at the point E in FIG. 9.

Although the above embodiment has described the case of etching polysilicon, remarkable effects can also be obtained even if the method of the present invention is applied to the etching of an oxide film, a metal such as a Si compound or Al, and a resist in a multi-layer resist. If the method of the present invention is applied to the etching of aluminum, a gas containing chlorine as a main component, such as $BCl_3+Cl_2$ or $SiCl_4+Cl_2+CHCl_3$ is used, while its pressure is set to 1 to 20 Pa. With the arrangement, an etching rate of 400 to 900 nm/min can be obtained.

Although the above embodiment has used the parallel-plate reactive ion dry etching apparatus as the plasma generating and processing apparatus, this is because significant effects can be achieved by the present invention in the case of using the parallel-plate reactive ion dry etching apparatus. The present invention has achieved sufficiently large effects even with respect to an electron cyclotron plasma or to an electromagnetic induced plasma.

In the plasma generating and processing apparatus according to the present invention, it is desirable to use a chamber system using a nonmagnetic material in order to prevent the spatial distribution of the applied magnetic field from being distorted. It is more desirable to use a chamber system to which a magnetic shield has been provided in order to prevent the influences of a magnetic filed from the outside.

Below, a CVD thin-film forming apparatus according to a second embodiment of the present invention will be described with reference to the drawings.

The CVD thin-film forming apparatus according to the second embodiment is different from the dry etching apparatus according to the first embodiment in that a heater 95 for controlling the thickness of the deposited film is provided on the sample stage 85 and that the etching terminal detector 90 is not provided. As for the other components, they are the same as those of the dry etching apparatus shown in FIG. 1, so that the detailed description thereof will be omitted by providing like reference numerals. It is desirable to set the temperature of the sample stage 85 to 400° C.

Figure 18:
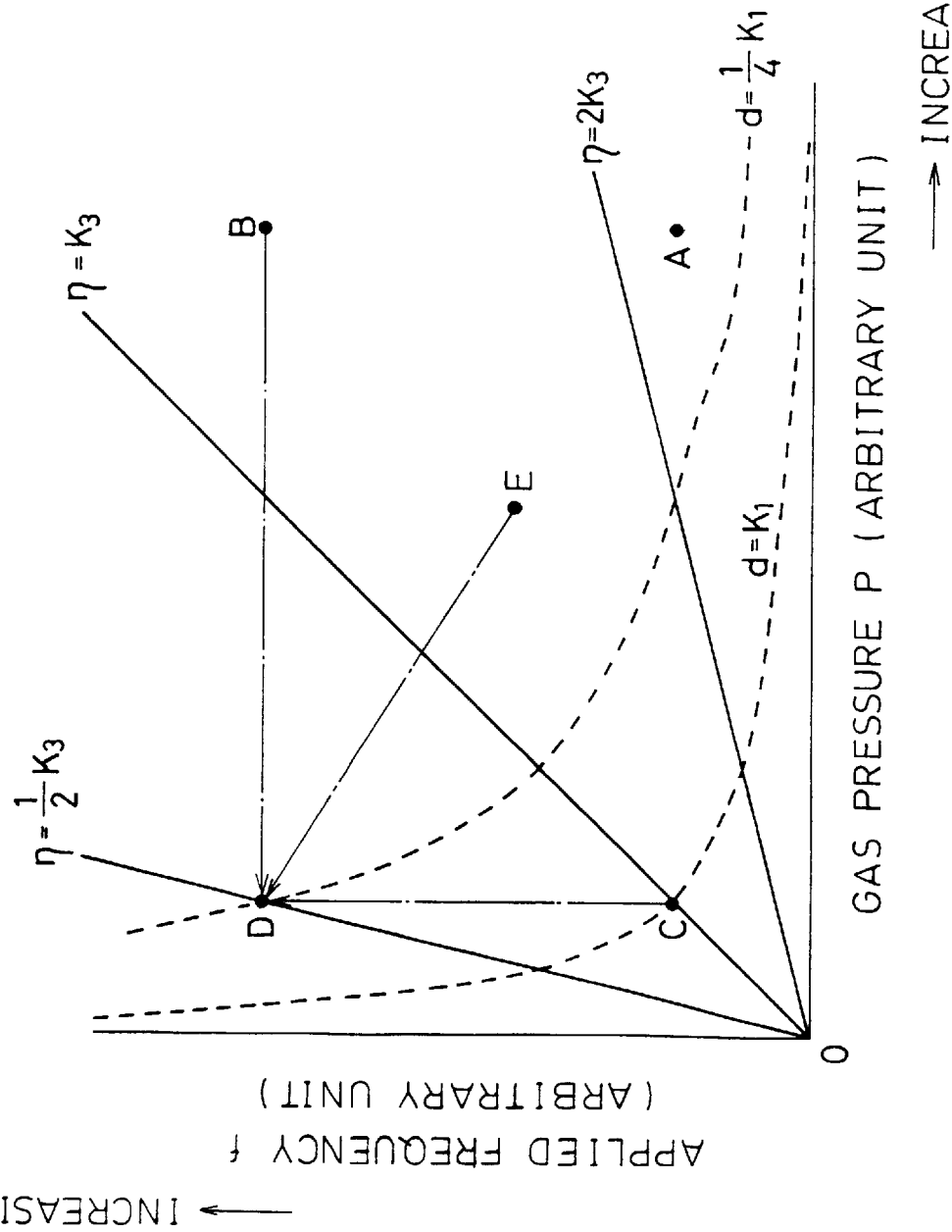
FIG. 18 is a view showing, by way of example, a method of switching a CVD thin-film forming operation mode in a two dimensional space of the gas pressure and the frequency.

FIG. 18 shows a specific method of switching the operation mode in the thin-film forming method in a two-dimensional space of the gas pressure P and the frequency f. The description of the drawing will be omitted, since it is basically the same as FIG. 8.

The following three methods will be described as examples of the method of switching the operation mode in the adopted thin-film forming method. In the first method, the main thin-film forming operation mode is adopted under the conditions at the point C in FIG. 18 and then the step coverage operation mode is adopted under the conditions at the point D in FIG. 18. In the second method, the main thin-film forming operation mode is adopted under the conditions at the point B in FIG. 18 and then the step coverage operation mode is adopted under the conditions at the point D in FIG. 18. In the third method, the main thin-film forming operation mode is adopted under the conditions at the point E in FIG. 18 and then the step coverage operation mode is adopted under the conditions at the point D in FIG. 18 by changing the frequency and the gas pressure at the same time.

Figure 19:
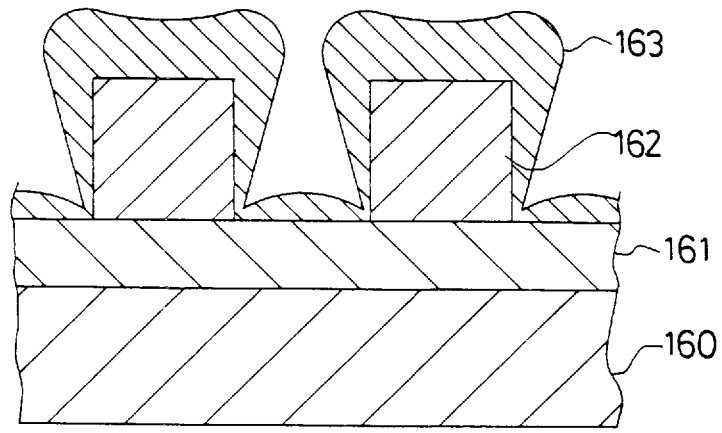
Figure 19:
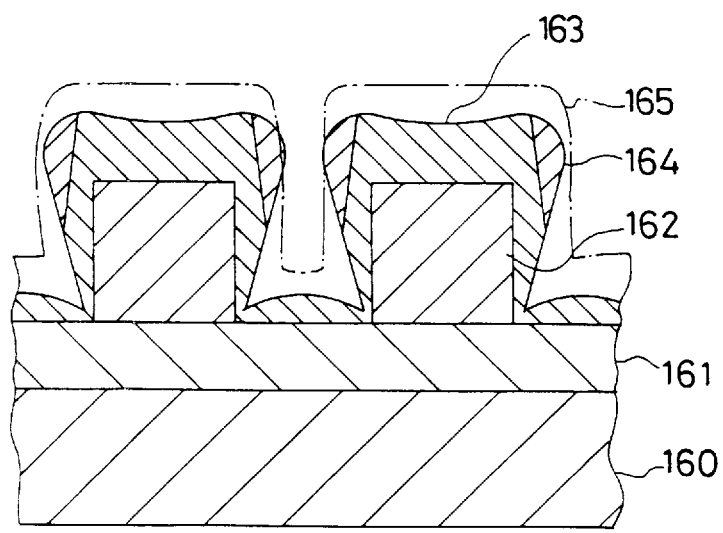

FIG. 19 diagrammatically shows a cross-sectional structure in the case of forming a TEOS film over the surface of aluminum wiring by switching from the main thin-film forming operation mode to the step coverage operation mode in accordance with the above first method. In this case, 30 sccm of TEOS gas, 50 sccm of $O_2$ gas, and 100 sccm of Ar gas are introduced into the chamber 81. The pressure of these gases is set to 10 Pa.

FIG. 19(*a*) shows the main thin-film forming operation mode and FIG. 19(*b*) shows the step coverage mending operation mode. On a Si substrate 160 is formed a thermal oxide film 161. Aluminum 162 deposited to the thickness of 0.8 μm by sputtering is formed into wiring with a width of 0.8 μm by photolithography and dry etching. On the aluminum 162 is deposited a TEOS film 163 by the above CVD processing apparatus.

In the main thin-film forming operation mode, the gas pressure is set to 10 Pa and the frequency of the high-frequency power applied to the sample stage 85 is set to 13.56 MHz. Thus, substantially conformal thin-film formation is accomplished by neutral radicals with a means for causing the satisfactory scattering of the ions in collision with the neutral particles, reducing the density of the ion fluxes arriving at the sample stage 85, lowering the energy of ions arriving at the sample stage 85, and distributing the incidence angles of ions arriving at the sample stage over a sufficiently wide range with respective to the sample. However, since the prospective solid angle at which radicals land on a surface of the sample with concave and convex portions differ from one point to another on the surface of the sample, the film thickness is varied from one point to another, as shown in FIG. 19(*a*).

In the step coverage operation mode, on the other hand, the gas pressure is fixed to 10 Pa and the frequency of the high-frequency power is set to 50 MHz. Thus, by increasing the density of ion fluxes arriving at the sample stage 85, increasing the energy of ions arriving at the sample stage 85, and distributing the incidence angles of ions arriving at the sample stage 85 substantially perpendicular to the surface of the sample, portions 164 which become thick at the upper edge corners of a concave portion of the sample with concave and convex portions are removed by ion sputtering. Subsequently, the main thin-film forming operation mode is adopted again, so that a thin film 165 with a uniform thickness can be formed on the sample with concave and convex portions with excellent step coverage.

The excellent thin-film forming characteristics obtained in the first method can similarly be obtained even if the second method is used in which the main thin-film forming operation mode is adopted under the conditions at the point B in FIG. 18 and then the step coverage operation mode is adopted under the conditions at the point D in FIG. 18 or the third method is used in which the main thin-film forming operation mode is adopted under the conditions at the point E in FIG. 18 and then the step coverage operation mode is adopted under the conditions at the point D in FIG. 18.

We claim:

1. A plasma generating and processing method comprising:
   a plasma generating step of introducing a gas into a vacuum chamber and generating a plasma in a plasma generation region; and
   a plasma processing step of applying high-frequency power to a sample stage in the vacuum chamber so that ions in the plasma are made incident upon said sample stage and perform dry etching process on a sample on the sample stage with a scattering probability, which is the probability of said ions being scattered in collision with neutral particles in a sheath region on the side of said sample stage, a value of the scattering probability being determined depending on a value of (pressure of gas)/(frequency of high-frequency power), wherein
   said plasma processing step comprises; the step of setting the value of (pressure of gas)/(frequency of high-frequency power) at a low value to obtain a low scattering probability in main etching, thereby increasing the energy of said ion fluxes and making the incidence directions of said ion fluxes perpendicular to a surface of said sample stage, and then increasing the value of (pressure of gas)/(frequency of high-frequency power) to obtain a high scattering probability in overetching, thereby reducing the energy of said ion fluxes and tilting the incidence directions of said ion fluxes from a perpendicular to the surface of the sample stage.

2. A plasma generating and processing method according to claim 1, wherein
   in said plasma processing step, the value of (pressure of gas)/(frequency of high-frequency power) is set at a low value in main etching and then increased in overetching, by: setting the frequency of said high-frequency power at the same value both in main etching and in overetching; setting the pressure of said gas at a low value in main etching; and increasing the pressure of said gas in overetching.

3. A plasma generating and processing method according to claim 1, wherein
   in said plasma processing step, the value of (pressure of gas)/(frequency of high-frequency power) is set at a low value in main etching and then increased in overetching, by: setting the pressure of said gas at the same value both in main etching and in overetching; setting the frequency of said high-frequency power at a high value in main etching; and reducing the frequency of said high-frequency power in overetching.

4. A plasma generating and processing method according to claim 3, wherein
   in said plasma processing step, the frequency of said high-frequency power in overetching is set at a value that is about one fifth of the frequency of said high-frequency power in main etching or more and does not exceed the frequency of said high-frequency power in main etching.

5. A plasma generating and processing method according to claim 1, wherein
   in said plasma processing step, the value of (pressure of gas)/(frequency of high-frequency power) is set at a low value in main etching and then increased in overetching, by: setting the pressure of said gas at a low value and setting the frequency of said high-frequency power at a high value in main etching; and increasing the pressure of said gas and reducing the frequency of said high-frequency power in overetching.

6. A plasma generating and processing method according to claim 5, wherein
   in said plasma processing step, the frequency of said high-frequency power in overetching is set at a value that is about one fifth of the frequency of said high-frequency power in main etching or more and does not exceed the frequency of said high-frequency power in main etching.

7. A plasma generating and processing method according to claim 1, wherein
   in said plasma processing step, the value of (pressure of gas)/(frequency of high-frequency power) that is set at a low value in main etching is increased in overetching so that the high scattering probability in overetching becomes 1.5 times the low scattering probability in main etching or higher.

8. A plasma generating and processing method according to claim 1, wherein
   in said plasma processing step, if the scattering probability is defined as (length of sheath region on sample-stage side)/(mean free path of ions in sheath region on sample-stage side), the value of (pressure of gas)/(frequency of high-frequency power) is set so that the value of the scattering probability becomes 6 or less in main etching.

9. A plasma generating and processing method according to claim 1, wherein
   in said plasma processing step, if the scattering probability is defined as (length of sheath region on sample-stage side)/(mean free path of ions in sheath region on sample-stage side), the value of (pressure of gas)/(frequency of high-frequency power) is set so that the value of the scattering probability becomes 6 or more in overetching.

10. A plasma generating and processing method according to claim 1, wherein
    in said plasma processing step, when a terminate signal was outputted from a terminal detector which outputs the terminate signal upon detecting the termination of main etching, the value of (pressure of gas)/(frequency of high-frequency power) is increased.

11. A plasma generating and processing method according to claim 1, wherein
    in said plasma processing steps the value of (pressure of gas)/(frequency of high-frequency power) is increased when a predetermined period of time elapsed.

12. A plasma generating and processing method according to claim 1, wherein
    in said plasma processing step, the frequency of said high-frequency power in main etching is set at a value equal to or higher than 10 MHz.

13. A plasma generating and processing method according to claim 1, wherein
    in said plasma processing step, the pressure of said gas in main etching is set at a value equal to or lower than 20 Pa.

14. A plasma generating and processing method comprising:
    a plasma generating step of introducing a gas into a vacuum chamber and generating a plasma in a plasma generation region; and
    a plasma processing step of applying high-frequency power to a sample stage in the vacuum chamber so that ions in the plasma are made incident upon said sample stage and perform thin-film forming process on a sample on the sample stage with a scattering probability which is the probability of said ions being scattered in collision with neutral particles in a sheath region on the side of said sample stage, a value of the scattering probability being determined depending on a value of (pressure of gas)/(frequency of high-frequency power), wherein said plasma processing step comprises the step of setting the value of (pressure of gas)/(frequency of high-frequency power) at a high value to obtain a high scattering probability in main thin-film formation, thereby reducing the energy of said ion fluxes and tilting the incidence directions of said ion fluxes from a perpendicular to a surface of the sample stage, and then reducing the value of (pressure of gas)/(frequency of high-frequency power) to obtain a low scattering probability in step-coverage mending, thereby increasing the energy of said ion fluxes and making the incidence directions of said ion fluxes perpendicular to the surface of said sample state.

15. A plasma generating and processing method according to claim 14, wherein in said plasma processing step, the value of (pressure of gas)/(frequency of high-frequency power) is set at a high value in main thin-film formation and then reduced in step-coverage mending, by: setting the frequency of said high-frequency power at the same value both in main thin-film formation and in step-coverage mending; setting the pressure of said gas at a high value in main thin-film formation; and reducing the pressure of said gas in step-coverage mending.

16. A plasma generating and processing method according to claim 14, wherein in said plasma processing step, the value of (pressure of gas)/(frequency of high-frequency power) is set at a high value in main thin-film formation and then reduced in step-coverage mending, by: setting the pressure of said gas at the same value both in main thin-film formation and in step-coverage mending; setting the frequency of said high-frequency power at a low value in main thin-film formation; and increasing the frequency of said high-frequency power in step-coverage mending.

17. A plasma generating and processing method according to claim 16, wherein in said plasma processing step, the frequency of said high-frequency power in step-coverage mending is set at a value equal to or less than about five times the frequency of said high-frequency power in main thin-film formation.

18. A plasma generating and processing method according to claim 14, wherein in said plasma processing step, the value of (pressure of gas)/(frequency of high-frequency power) is set at a high value in main thin-film formation and then reduced in step-coverage mending, by: setting the pressure of said gas at a high value and setting the frequency of said high-frequency power at a low value in main thin-film formation and then reducing the pressure of said gas and increasing the frequency of said high-frequency power in step-coverage mending.

19. A plasma generating and processing method according to claim 18, wherein in said plasma processing step, the frequency of said high-frequency power in step-coverage mending is set at a value equal to or less than about five times the frequency of said high-frequency power in main thin-film formation.

20. A plasma generating and processing method according to claim 14, wherein in said plasma processing step, the value of (pressure of gas)/(frequency of high-frequency power) that is set at a high value in main thin-film formation is reduced in step-coverage mending so that the high scattering probability in main thin-film formation becomes 1.5 times the low scattering probability in step-coverage mending or more.

21. A plasma generating and processing method according to claim 14, wherein in said plasma processing step, if the scattering probability is defined as (length of sheath region on sample-stage side)/(mean free path of ions in sheath region on sample-stage side), the value of (pressure of gas)/(frequency of high-frequency power) is set so that the value of the scattering probability becomes 6 or more in main thin-film formation.

22. A plasma generating and processing method according to claim 14, wherein in said plasma processing step, if the scattering probability is defined as (length of sheath region on sample-stage side)/(mean free path of ions in sheath region on sample-stage side), the value of (pressure of gas)/(frequency of high-frequency power) is set so that the value of the scattering probability becomes 6 or less in step-coverage mending.

23. A plasma generating and processing method according to claim 14, wherein in said plasma processing step, the value of (pressure of gas)/(frequency of high-frequency power) is reduced when a predetermined period of time elapsed.

24. A plasma generating and processing method according to claim 14, wherein in said plasma processing step, the frequency of said high-frequency power is set at a value equal to or higher than 10 MHz.

25. A plasma generating and processing method according to claim 14, wherein in said plasma processing step, the pressure of said gas is set at a value equal to or lower than 20 Pa.

* * * * *

UNITED STATES PATENT AND TRADEMARK OFFICE
CERTIFICATE OF CORRECTION

PATENT NO. : 5,869,402
DATED : February 9, 1999
INVENTOR(S) : Harafuji, et. al.

It is certified that error appears in the above-identified patent and that said Letters Patent is hereby corrected as shown below:

Claim 11, line 3, change "steps" to --step,--.

Signed and Sealed this

Fifth Day of December, 2000

Attest:

Q. TODD DICKINSON

Attesting Officer

Director of Patents and Trademarks